(12) United States Patent
Li et al.

(10) Patent No.: US 8,395,936 B2
(45) Date of Patent: Mar. 12, 2013

(54) USING CHANNEL-TO-CHANNEL COUPLING TO COMPENSATE FLOATING GATE-TO-FLOATING GATE COUPLING IN PROGRAMMING OF NON-VOLATILE MEMORY

(75) Inventors: Haibo Li, Sunnyvale, CA (US); Guirong Liang, Santa Clara, CA (US)

(73) Assignee: SanDisk Technologies Inc., Plano, TX (US)

( * ) Notice: Subject to any disclaimer, the term of this patent is extended or adjusted under 35 U.S.C. 154(b) by 176 days.

(21) Appl. No.: 13/103,854

(22) Filed: May 9, 2011

(65) Prior Publication Data

US 2012/0287716 A1    Nov. 15, 2012

(51) Int. Cl.
*G11C 11/34* (2006.01)

(52) U.S. Cl. ......... 365/185.03; 365/185.17; 365/185.18; 365/185.19; 365/185.21; 365/185.22; 365/185.24; 365/185.33

(58) Field of Classification Search ............. 365/185.03, 365/185.17, 185.18, 185.19, 185.21, 185.22, 365/185.24, 185.33
See application file for complete search history.

(56) References Cited

U.S. PATENT DOCUMENTS

| | | | |
|---|---|---|---|
| 6,999,344 B2 | 2/2006 | Hosono et al. | |
| 7,064,980 B2 | 6/2006 | Cernea et al. | |
| 7,187,585 B2 | 3/2007 | Li et al. | |
| 7,193,898 B2 | 3/2007 | Cernea | |
| 7,196,928 B2 | 3/2007 | Chen | |
| 7,251,160 B2 | 7/2007 | Li et al. | |
| 7,522,454 B2 | 4/2009 | Li et al. | |
| 7,606,072 B2 * | 10/2009 | Sekar et al. | 365/185.17 |
| 7,876,611 B2 | 1/2011 | Dutta et al. | |
| 8,130,551 B2 * | 3/2012 | Oowada et al. | 365/185.19 |
| 8,218,366 B2 * | 7/2012 | Dong et al. | 365/185.22 |
| 8,300,458 B2 * | 10/2012 | Cernea | 365/185.03 |
| 2007/0133288 A1 | 6/2007 | Iwai et al. | |
| 2009/0059660 A1 | 3/2009 | Lee et al. | |

* cited by examiner

*Primary Examiner* — Trong Phan
(74) *Attorney, Agent, or Firm* — Vierra Magen Marcus LLP

(57) ABSTRACT

In a non-volatile storage system, during a verify operation, a verify voltage of a currently-sensed target data state is applied to a selected word line. A higher, nominal bit line voltage is used for the storage elements which have the currently-sensed target data state and a verify status of pass or no pass, a target data state lower than the currently-sensed target data state and a verify status of pass or no pass, or a target data state higher than the currently-sensed target data state and a verify status of pass. A lower bit line voltage is used for the storage elements which have the target data state higher than the currently-sensed target data state and a verify status of no pass, to enhance channel-to-channel coupling, as an offset to floating gate-to-floating gate coupling which is later caused by these storage elements.

20 Claims, 17 Drawing Sheets

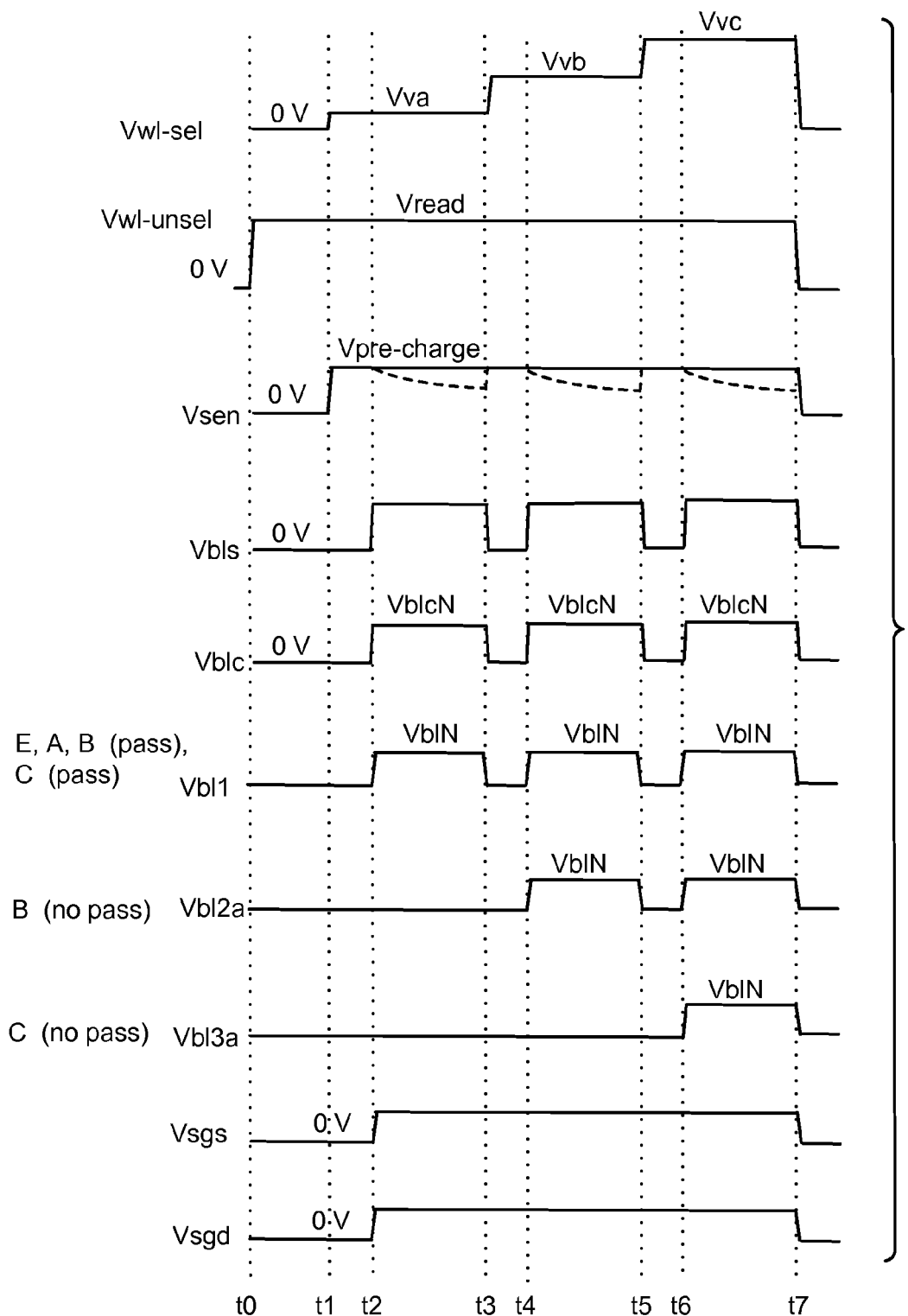

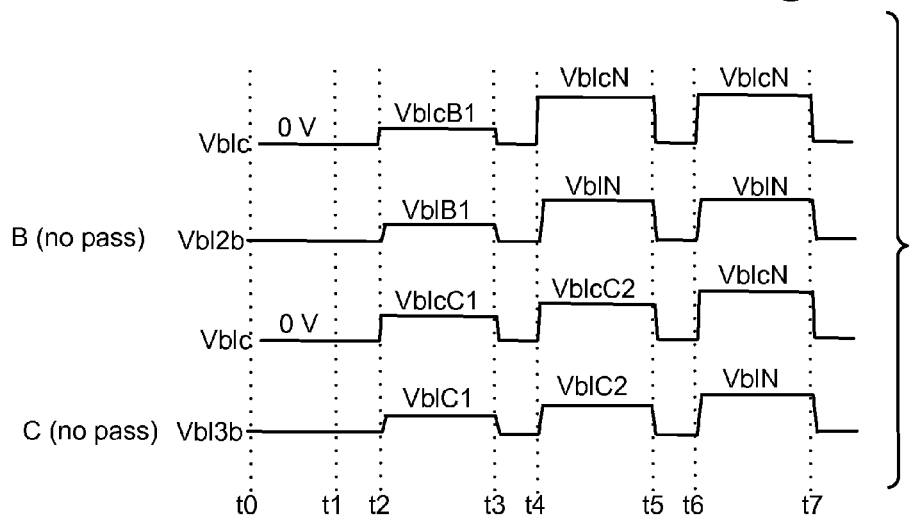

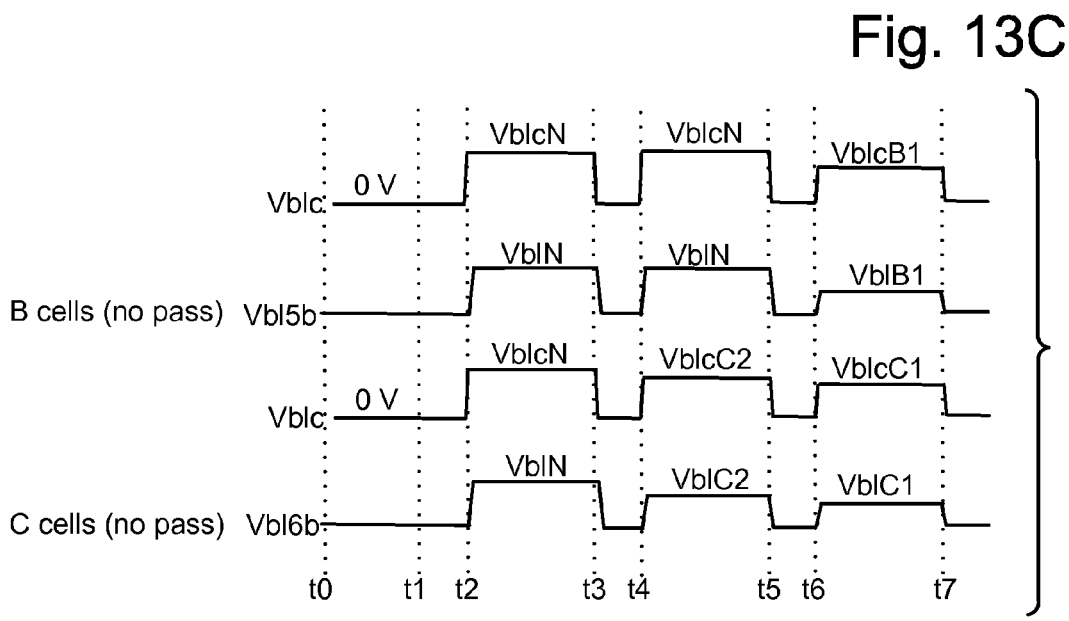

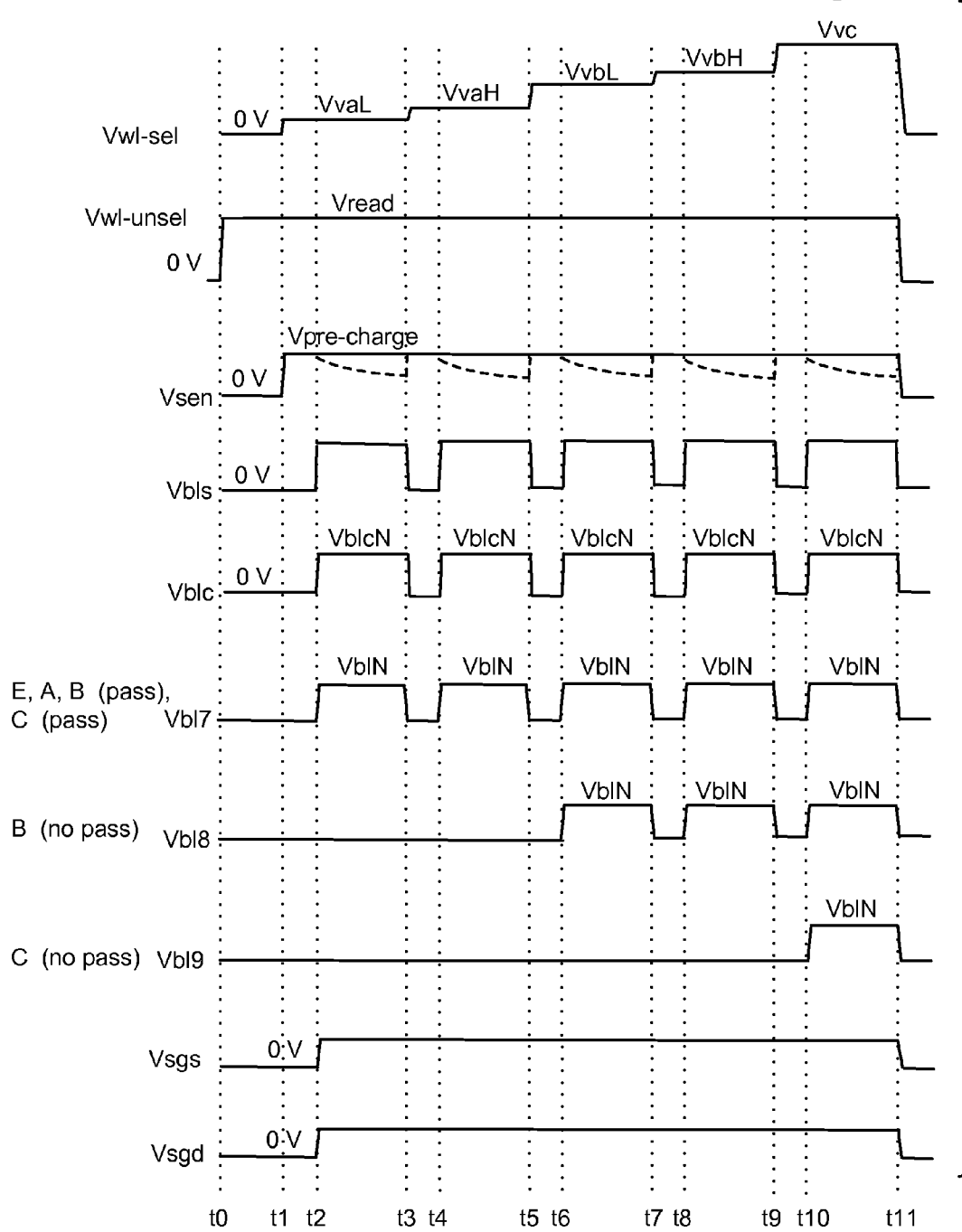

Fig. 14B

Vbl based on target data state, verify level and pass/no-pass (P/NP) status

|   | VvaL | VvaH | VvbL | VvbH | Vvc |
|---|------|------|------|------|-----|
| E | N/N  | N/N  | N/N  | N/N  | N/N |
| A | N/N  | N/N  | N/N  | N/N  | N/N |
| B | N/0  | N/0  | N/N  | N/N  | N/N |
| C | N/0  | N/0  | N/0  | N/0  | N/N |

Fig. 15

Vbl based on target data state, verify level and pass/no-pass (P/NP) status

|   | Vva | Vvb | Vvc | Vvd | Vve | Vvf | Vvg |
|---|-----|-----|-----|-----|-----|-----|-----|
| E | N/N | N/N | N/N | N/N | N/N | N/N | N/N |
| A | N/N | N/N | N/N | N/N | N/N | N/N | N/N |
| B | N/0 | N/N | N/N | N/N | N/N | N/N | N/N |
| C | N/0 | N/0 | N/N | N/N | N/N | N/N | N/N |
| D | N/0 | N/0 | N/0 | N/N | N/N | N/N | N/N |
| E | N/0 | N/0 | N/0 | N/0 | N/N | N/N | N/N |
| F | N/0 | N/0 | N/0 | N/0 | N/0 | N/N | N/N |
| G | N/0 | N/0 | N/0 | N/0 | N/0 | N/0 | N/N |

USING CHANNEL-TO-CHANNEL COUPLING TO COMPENSATE FLOATING GATE-TO-FLOATING GATE COUPLING IN PROGRAMMING OF NON-VOLATILE MEMORY

BACKGROUND

The present technology relates to non-volatile memory.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage (Vth) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a storage element or cell with a floating gate that is used to store two ranges of charges and, therefore, the storage element can be programmed/erased between two states, e.g., an erased state and a programmed state. Such a flash memory device is sometimes referred to as a binary flash memory device because each storage element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each storage element can store two bits of data when the storage element can be placed in one of four discrete charge bands corresponding to four distinct threshold voltage ranges.

Typically, a program voltage Vpgm applied to the control gate during a program operation is applied as a series of pulses that increase in magnitude over time. The program voltage can be applied to a selected word line. In one possible approach, the magnitude of the pulses is increased with each successive pulse by a predetermined step size or increment, e.g., 0.2-0.4 V. Vpgm can be applied to the control gates of flash memory elements. In the periods between the program pulses, verify operations are carried out. That is, the programming level of each element of a group of storage elements being programmed in parallel is read between successive program pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, typically Vpgm is applied to the control gate and the bit line is grounded, causing electrons from the channel of a storage element to be injected into the floating gate. When electrons accumulate in the floating gate, the floating gate becomes negatively charged and the threshold voltage of the storage element is raised so that it is considered to be in a programmed state.

However, electromagnetic coupling effects in memory devices are becoming increasingly important as dimensions are scaled down.

BRIEF DESCRIPTION OF THE DRAWINGS

In the drawings, like-numbered elements correspond to one another.

FIG. 12A depicts waveforms used in an example verify portion of a program-verify iteration, where an ascending sequence of verify voltages is applied to a selected word line.

FIG. 12B depicts a table of bit line voltages for the example of FIG. 12A.

FIG. 12C depicts a table of bit line voltages for an alternative to the example of FIG. 12A.

FIG. 12D depicts alternative waveforms for the B-state and C-state storage elements with a verify status of no pass, in FIG. 12A.

FIG. 12E depicts a table of bit line voltages for the example of FIG. 12D.

FIG. 13B depicts a table of bit line voltages for the example of FIG. 13A.

FIG. 13C depicts alternative waveforms for the B-state and C-state storage elements with a verify status of no pass, in FIG. 13A.

FIG. 13D depicts a table of bit line voltages for the example of FIG. 13C.

FIG. 14A depicts waveforms used in another example verify portion of a program-verify iteration, where an ascending sequence of verify voltages is applied to a selected word line.

FIG. 14B depicts a table of bit line voltages for the example of FIG. 14A.

FIG. 15 depicts a table of bit line voltages for an example verify portion of a program-verify iteration, where eight data states are used.

DETAILED DESCRIPTION

Figure 1:
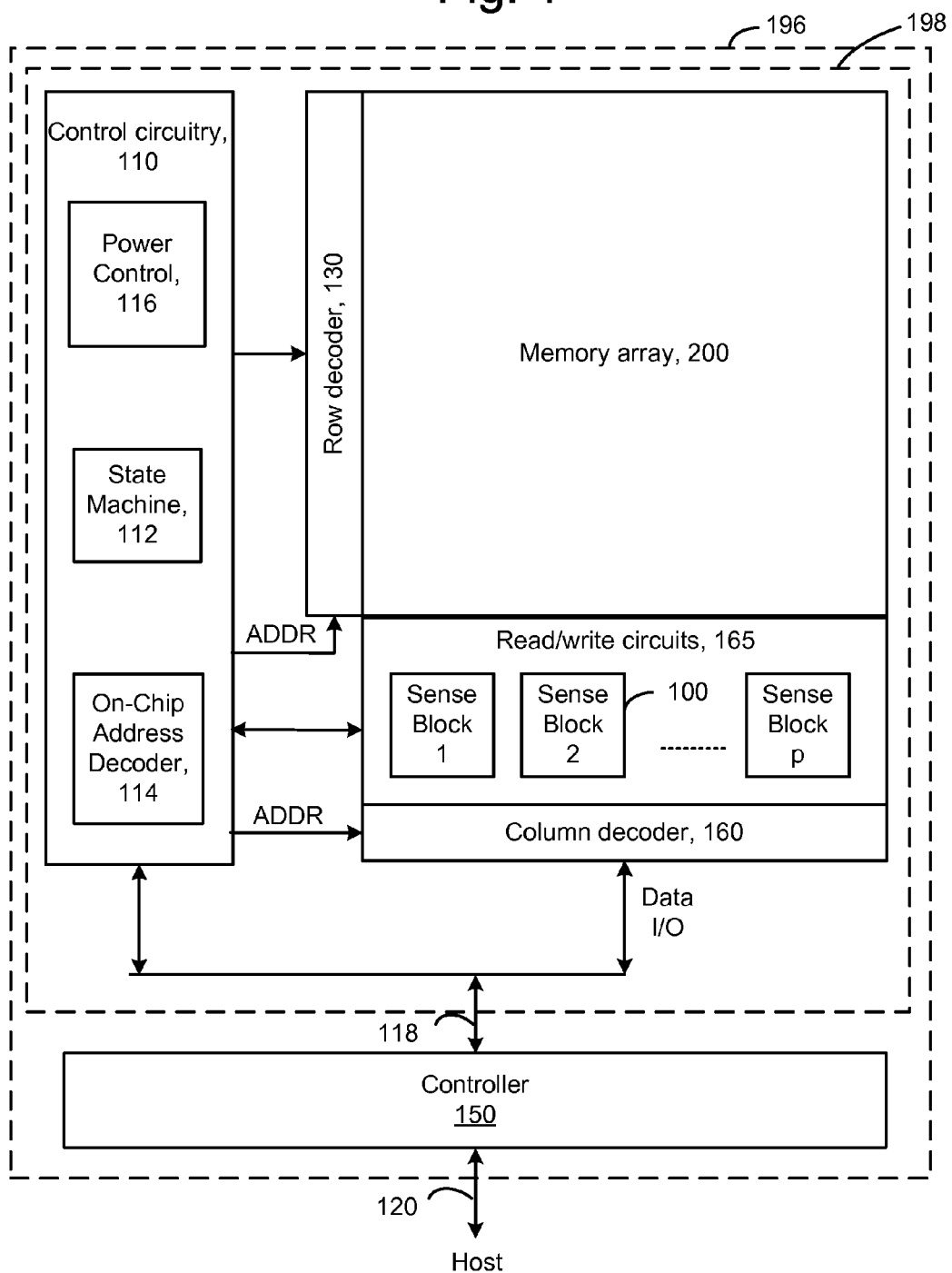
FIG. 1 is a block diagram of a non-volatile memory system using single row/column decoders and read/write circuits.

A method and non-volatile storage system are provided in which programming is optimized to reduce electromagnetic coupling effects.

A programming operation typically includes a number of program-verify iterations, where a program pulse is applied to a selected word line in a program portion of each program-verify iteration, and verify pulses are applied to the selected word line in a verify portion of each program-verify iteration. One or more verify pulses can be applied for each target data state. Moreover, sensing operations are performed in connection with the verify pulses. After the programming operation is completed, a read operation is performed to determine the data states of the storage elements. However, the conditions under which a storage element is sensed during the verify portion of a program-verify iteration can be different than the conditions under which the storage element is sensed during the read operation. For example, capacitive coupling can affect the read threshold voltage of a storage element. Capacitive coupling can be caused by charges on the floating gate and/or channel of one or more neighboring storage elements.

In particular, a subject storage element having a relatively low target data state (with a relatively low threshold voltage) may complete programming before storage elements having relatively high target data states (with relatively high threshold voltages), with some programming techniques. When the subject storage element attains a verify status of pass, indicating that it has completed programming, the floating gate-to-floating gate capacitive coupling from a neighbor storage element with a higher target data state can be less than when the subject storage element is later read. This is true because the neighbor storage element may undergo additional program-verify iterations in which its threshold voltage is raised, and additional charge is stored in its floating gate, before it completes programming.

As a result, the threshold voltage of the subject storage element can appear to be higher when it is read than when it completed programming. This leads to widening of the threshold voltage distribution of a set of storage elements. It is also known that neighboring channel-to-channel coupling effect can cause a wider threshold voltage distribution of a set of storage elements with a lower tail. This neighboring channel-to-channel coupling effect is caused by the discrepancy between verify and read operations, in that a lower bit line voltage (e.g., 0 V) is applied to the neighboring bit line/channel such that the target cell's channel is coupled lower during verify, while a nominal voltage (VblN) is applied to all bit-lines during read. It is of great interest to use a neighboring channel-to-channel coupling effect to compensate a floating gate-to-floating gate coupling effect between neighboring bit lines. To achieve this, the verify portion of a program-verify iteration can be configured so that the subject storage element experiences enhanced channel-to-channel coupling from a channel of a neighbor storing element before the subject storage element completes programming, when the neighbor storing element is a probable source of floating gate-to-floating gate coupling. The neighbor storing element is a probable source of floating gate-to-floating gate coupling when it has a higher target data state which has not yet been reached (e.g., it has a verify status of no pass).

The increase in channel-to-channel coupling allows the subject storage element to complete programming at a threshold voltage which is lower than an optimal level. However, when the higher target data state storage elements complete programming, and the subject storage element is subsequently read, the threshold voltage of the subject storage element could appear to be at the optimal level due to higher floating gate-to-floating gate coupling from the neighbor storage element, compared to when the subject storage element completed programming. As a result, narrow threshold voltage distributions of a set of storage elements can be achieved.

In particular implementations, during the verify portion of a program-verify iteration, the channel of a storage element is subjected to a voltage based on the current verify pulse, the target data state of the storage element, and whether the storage element has passed a verify test by reaching a verify level associated with the target data state. In one approach, the channel of a storage element is subject to 0 V or other relatively low voltage when the current verify pulse is for a target data state which is lower than the target data state of this storage element, and the storage element has a verify status of no pass. The channel of the storage element is then subject to a relatively high voltage such as a nominal voltage when the current verify pulse is for a target data state which is equal to or greater than the target data state of the storage element. In a variation, the channel of a storage element is subject to a voltage which is relatively lower when the storage element is expected to cause relatively more floating gate-to-floating gate coupling as it continues programming. The amount of floating gate-to-floating gate coupling which a first storage element causes to a second storage element is a function of the increase in the threshold voltage of the first storage element after the second storage element completes programming.

An example memory system which can be used is discussed next. FIG. 1 is a block diagram of a non-volatile memory system using single row/column decoders and read/write circuits. The diagram illustrates a memory device 196 having read/write circuits for reading and programming a page of storage elements in parallel, according to one embodiment. Memory device 196 may include one or more memory die 198. Memory die 198 includes a two-dimensional memory array of storage elements 200, control circuitry 110, and read/write circuits 165. The memory array 200 is discussed further in connection with FIGS. 2 and 3.

In some embodiments, the array of storage elements can be three dimensional. The memory array 200 is addressable by word lines via a row decoder 130 and by bit lines via a column decoder 160. The read/write circuits 165 include multiple sense blocks (1, 2 . . . p) 100 and allow a page of storage elements to be read or programmed in parallel. Typically a controller 150 is included in the same memory device 196 (e.g., a removable storage card) as the one or more memory die 198. Commands and data I/O are transferred between the host and controller 150 via lines 120 and between the controller and the one or more memory die 198 via lines 118.

The control circuitry 110 cooperates with the read/write circuits 165 to perform memory operations on the memory array 200, and includes a state machine 112, an on-chip address decoder 114, and a power control module 116. The state machine 112 provides chip-level control of memory operations. The on-chip address decoder 114 provides an address interface between that used by the host or a memory controller to the hardware address used by the decoders 130 and 160. The power control module 116 controls the power and voltages supplied to the word lines and bit lines during memory operations.

In some implementations, some of the components of FIG. 1 can be combined. In various designs, one or more of the components (alone or in combination), other than memory array 200, can be thought of as a control circuit. For example, one or more control circuits may include any one of, or a combination of, control circuitry 110, state machine 112, decoders 114/160, power control 116, sense blocks 100 (including the processor 592 in FIG. 5), read/write circuits 165, and controller 150, and so forth. The sense block 100 is discussed further in connection with FIGS. 5 and 6.

In another embodiment, a non-volatile memory system uses dual row/column decoders and read/write circuits. Access to the memory array 200 by the various peripheral circuits is implemented in a symmetric fashion, on opposite sides of the array, so that the densities of access lines and circuitry on each side are reduced by half. Thus, the row decoder is split into two row decoders and the column decoder into two column decoders. Similarly, the read/write circuits are split into read/write circuits connecting to bit lines from the bottom and read/write circuits connecting to bit lines from the top of the array 200. In this way, the density of the read/write modules is essentially reduced by one half.

Other types of non-volatile memory in addition to NAND flash memory can also be used.

Figure 2:
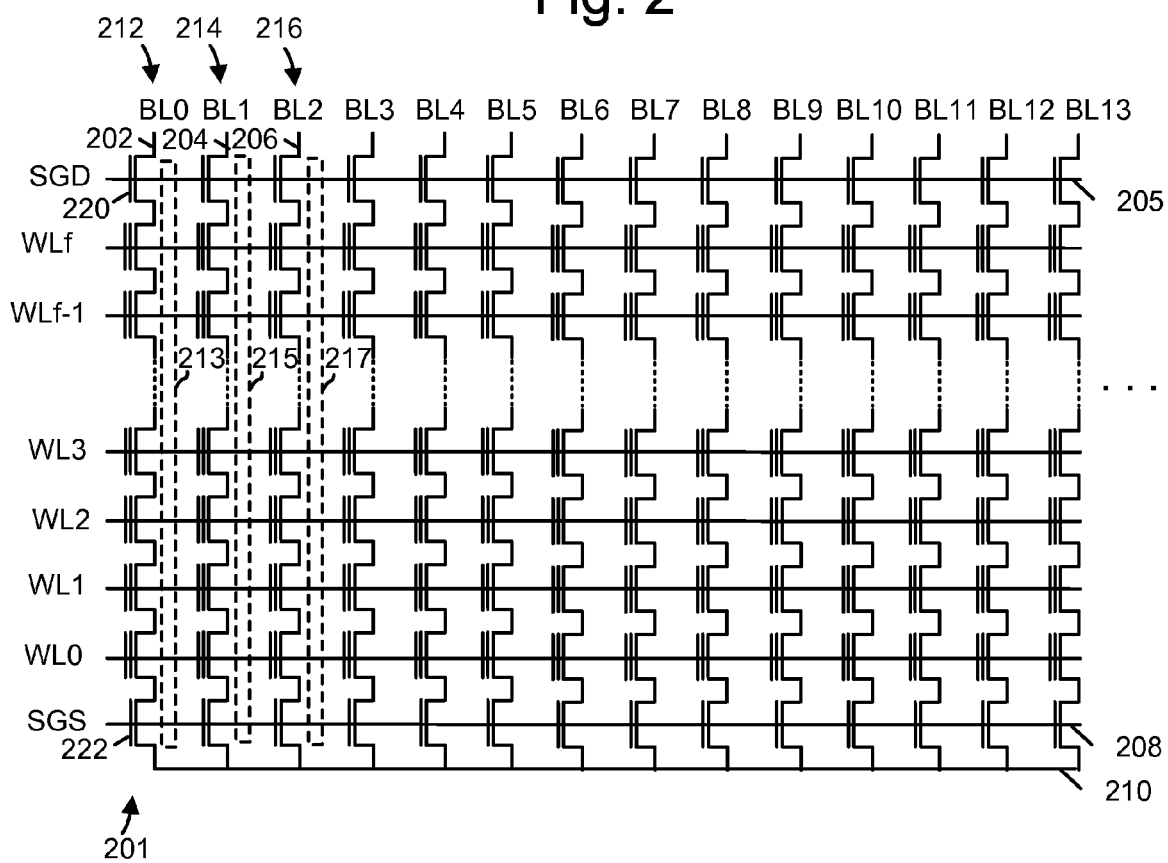
FIG. 2 depicts an example block in a memory array, such as the memory array 200 of FIG. 1.

FIG. 2 depicts an example block in a memory array, such as the memory array 200 of FIG. 1. See also FIG. 3. The block 201 includes example bit lines BL0 (202), BL1 (204), BL2 (206) ... and m word lines WL0 through WLf. SGS represents a common control line 208 for a source-side select gate, e.g., 222, SGD represents a common control line 205 for a drain-side select gate, e.g., 220, and line 210 represents a common source line for the block 201. Each bit line is in communication with a set of storage elements in a respective NAND string, such as NAND strings 212, 214 and 216 associated with BL0, BL1 and BL2, respectively. All bit line programming can be used in which adjacent NAND strings in a block are programmed concurrently. That is, for a selected word line, adjacent storage elements in different NAND strings are programmed concurrently.

Example channel regions 213, 215, 217 which are associated with the NAND strings 212, 214 and 216, respectively, may be created in the substrate. Note that the storage elements and channel regions are depicted as if they were rotated 90 degrees from their actual position.

When programming a storage element, a program pulse is applied to the control gate of the storage element, e.g., via an associated word line, and the bit line associated with the storage element is grounded. Electrons from the channel are injected into the floating gate. When electrons accumulate in the floating gate, the floating gate becomes negatively charged and the Vth of the storage element is raised. When performing a verify operation, a verify pulse is applied to the associated word line, and sensing circuitry which is in communication with the bit lines is configured for sensing. When performing a read operation, a read pulse is applied to the associated word line, and sensing circuitry which is in communication with the bit lines is configured for sensing.

Figure 3:
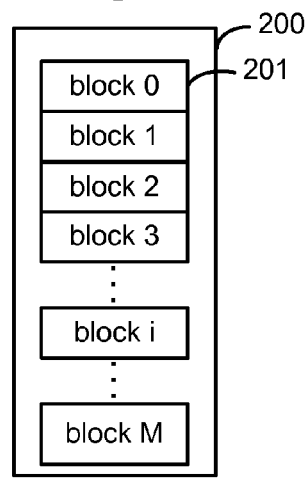
FIG. 3 depicts a memory array 200 comprising multiple blocks, such as the block 201 of FIG. 2.

FIG. 3 depicts a memory array 200 comprising multiple blocks, such as the block 201 of FIG. 2. As one example, a NAND flash EEPROM is described that is partitioned into M=1,024 blocks. The data stored in each block can be simultaneously erased. In one embodiment, the block is the minimum unit of storage elements that are simultaneously erased. Storage elements can be erased by raising the p-well to an erase voltage (e.g., 14-22 V) and grounding the word lines of a selected block while floating the source and bit lines. Erasing can be performed on the entire memory array, separate blocks, or another unit of the storage elements which is a portion of the memory device. During erasing, electrons are transferred from the floating gates of the storage elements to the p-well region so that the Vth of the storage elements becomes negative. A strong electric field is applied to the tunnel oxide layers of selected storage elements and the data of the selected storage elements are erased as electrons of the floating gates are emitted to the substrate side, typically by Fowler-Nordheim tunneling mechanism. As electrons are transferred from the floating gate to the p-well region, the Vth of a selected storage element is lowered.

Figure 4:
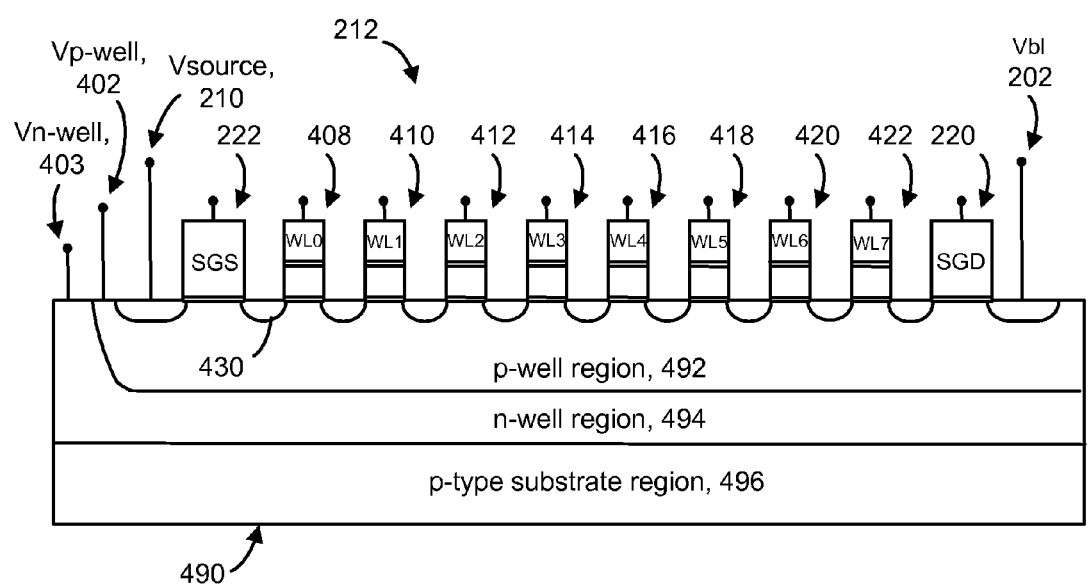
FIG. 4 depicts a cross-sectional view of the NAND string 212 of FIG. 2 formed on a substrate.

FIG. 4 depicts a cross-sectional view of the NAND string 212 of FIG. 2 formed on a substrate. The view is simplified and not to scale. The NAND string 212 includes a source-side select gate 222, a drain-side select gate 220, and eight storage elements 408, 410, 412, 414, 416, 418, 420 and 422, formed on a substrate 490. A number of source/drain regions, one example of which is source drain/region 430, are provided on either side of each storage element and the select gates 222 and 220. In one approach, the substrate 490 employs a triple-well technology which includes a p-well region 492 within an n-well region 494, which in turn is within a p-type substrate region 496. The NAND string and its non-volatile storage elements can be formed, at least in part, on the p-well region. A source supply line 210 with a potential of Vsource is provided in addition to a bit line 202 with a potential of Vbl. In one possible approach, a voltage Vp-well can be applied to the p-well region 492 via a terminal 402. A voltage Vn-well can also be applied to the n-well region 494 via a terminal 403.

During a sensing operation such as a read or verify operation, including an erase-verify operation, in which the condition of a storage element, such as its Vth, is ascertained, a control gate voltage is provided on a selected word line which is associated with a selected storage element. Further, the control gate of a storage element may be provided as a portion of the word line. For example, WL0, WL1, WL2, WL3, WL4, WL5, WL6 and WL7 can extend via the control gates of storage elements 408, 410, 412, 414, 416, 418, 420 and 422, respectively. A read pass voltage, Vread, can be applied to unselected word lines associated with NAND string 212, in one possible boosting scheme. Other boosting schemes apply Vread to some word lines and lower voltages to other word lines. Vsgs and Vsgd are applied to the select gates 222 and 220, respectively.

Figure 5:
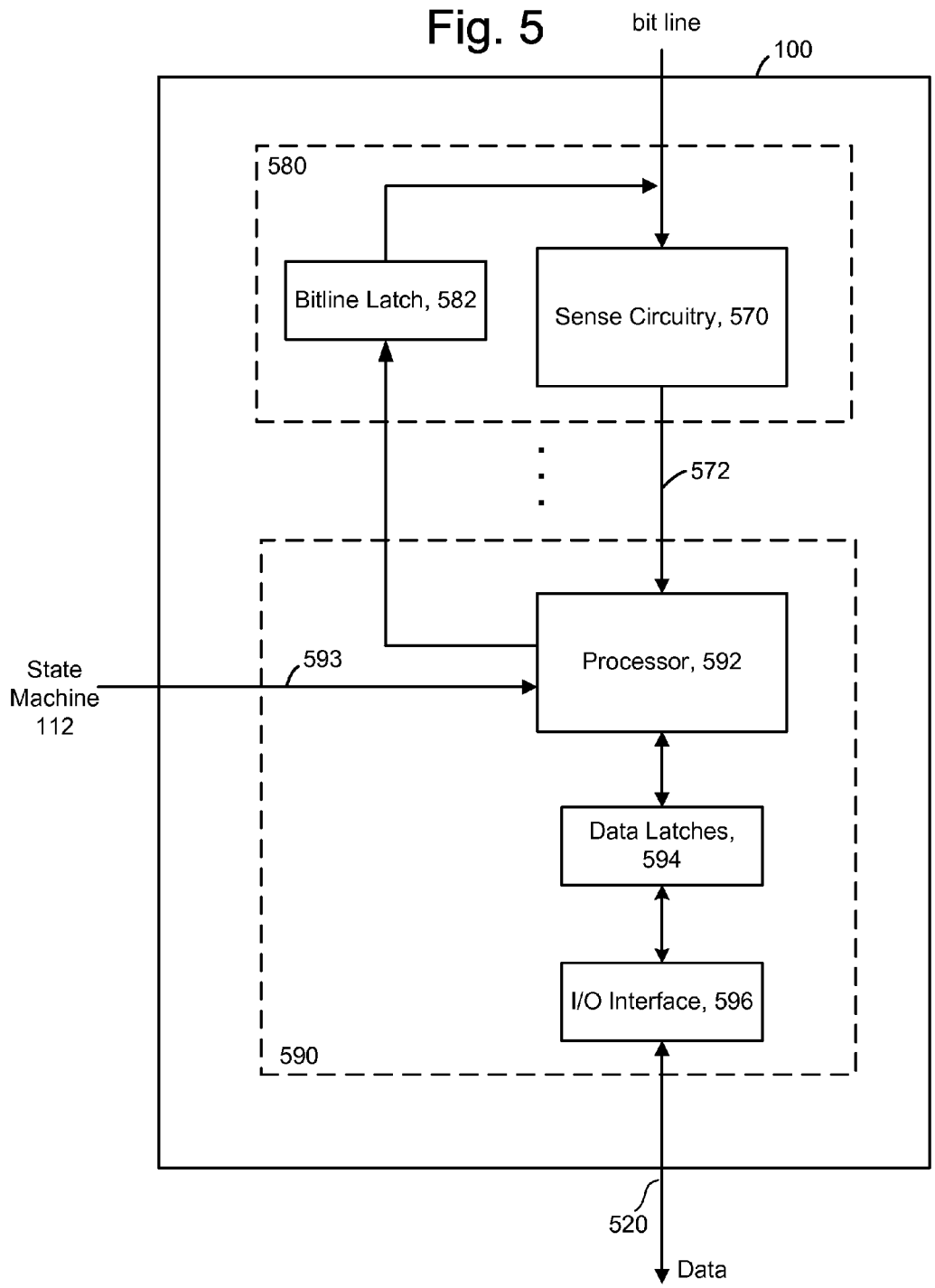
FIG. 5 is a block diagram depicting one embodiment of the sense block 100 of FIG. 1.

FIG. 5 is a block diagram depicting one embodiment of the sense block 100 of FIG. 1. An individual sense block 100 is partitioned into a core portion, referred to as a sense module 580, and a common portion 590. In one embodiment, there is a separate sense module 580 for each bit line and one common portion 590 for a set of multiple sense modules 580. In one example, a sense block will include one common portion 590 and eight sense modules 580. Each of the sense modules in a group will communicate with the associated common portion via a data bus 572.

Sense module 580 comprises sense circuitry 570 that determines whether a conduction current in a connected bit line is above or below a predetermined threshold level. Sense module 580 also includes a bit line latch 582 that is used to set a voltage condition on the connected bit line. For example, a predetermined state latched in bit line latch 582 will result in the connected bit line being pulled to a state designating program inhibit (e.g., 1.5-3 V). 2-page data latches may be used.

Common portion 590 comprises a processor 592, a set of data latches 594 and an I/O Interface 596 coupled between the set of data latches 594 and data bus 520. Processor 592 performs computations. For example, one of its functions is to determine the data stored in the sensed storage element and store the determined data in the set of data latches. The set of data latches 594 is used to store data bits determined by processor 592 during a read operation. It is also used to store data bits imported from the data bus 520 during a program operation. The imported data bits represent write data meant to be programmed into the memory. I/O interface 596 provides an interface between data latches 594 and the data bus 520.

During reading or other sensing, a state machine 112 controls the supply of different control gate voltages to the addressed storage element. As it steps through the various predefined control gate voltages corresponding to the various memory states supported by the memory, the sense module 580 may trip at one of these voltages and an output will be provided from sense module 580 to processor 592 via bus 572. At that point, processor 592 determines the resultant memory state by consideration of the tripping event(s) of the sense module and the information about the applied control gate voltage from the state machine via input lines 593. It then computes a binary encoding for the memory state and stores the resultant data bits into data latches 594. In another embodiment of the core portion, bit line latch 582 serves both as a latch for latching the output of the sense module 580 and as a bit line latch as described above.

During program or verify operations, the data to be programmed is stored in the set of data latches 594 from the data bus 520. The program operation, under the control of the state machine, comprises a series of programming voltage pulses applied to the control gates of the addressed storage elements. Each program pulse is followed by a read back (verify operation) to determine if the storage element has been programmed to the desired data state. Processor 592 monitors the read back data state relative to the desired data state. When the two are in agreement, the processor 592 sets the bit line latch 582 so as to cause the bit line to be pulled to a state designating program inhibit. This inhibits the storage element coupled to the bit line from further programming even if program pulses appear on its control gate. In other embodiments, the processor initially loads the bit line latch 582 and the sense circuitry sets it to an inhibit value during the verify process.

Data latch stack 594 contains a stack of data latches corresponding to the sense module. In one embodiment, there are three data latches per sense module 580. The data latches can be implemented as a shift register so that the parallel data stored therein is converted to serial data for data bus 520, and vice-versa. All the data latches corresponding to the read/write block of m storage elements can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Figure 6:
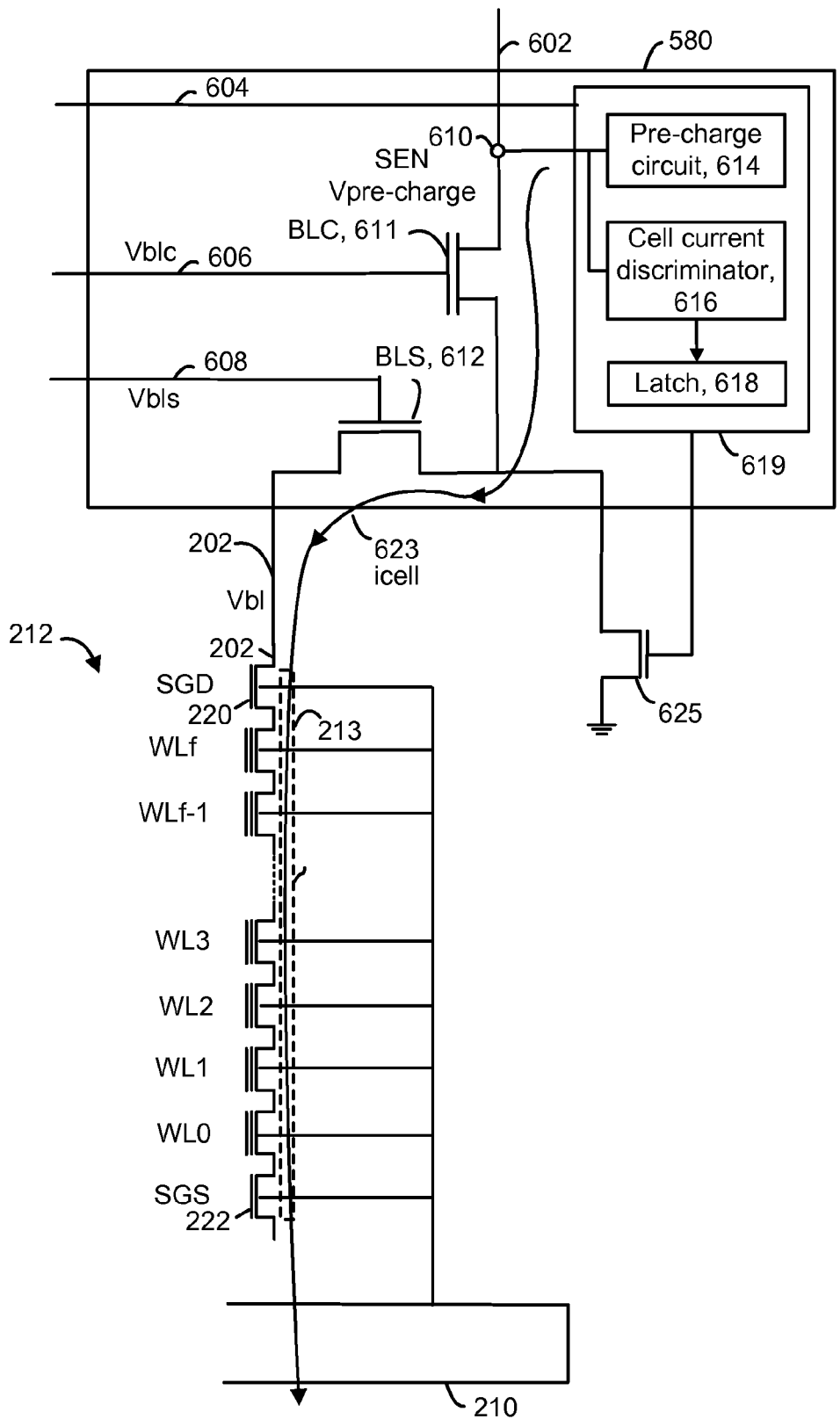
FIG. 6 depicts an example implementation of the sense module 580 of FIG. 5 with the NAND string 212 of FIG. 2.

FIG. 6 depicts an example implementation of the sense module 580 of FIG. 5 with the NAND string 212 of FIG. 2. In a simplified example, the sense module is connected to the NAND string 212 via the bit line 202 having a voltage Vbl. The NAND string 212 includes storage elements which are in communication with word lines WL0, WL1, WL2 .... The NAND string extends between the bit line and a source line 210. The storage elements are coupled to a p-well region of a substrate. The channel region 213 in the p-well region of the substrate extends directly below the NAND string. The sense module 580 includes a sense amplifier 619, including a pre-charge circuit 614, a cell current discriminator 616 and a latch 618. Control signals are provided via a path 604. The pre-charge circuit 614 can provide a pre-charge voltage, Vpre-charge, to a sense node 610. A BLC (bit line clamp) transistor 611 is a low voltage transistor which is made conductive in response to a voltage Vblc on path 606. The BLC transistor 611 sets Vbl=Vblc−Vth of the BLC transistor. Vbl can be set individually for each bit line by adjusting Vblc. A BLS (bit line sensing) transistor 612 is coupled to the bit line 202. The BLS transistor 612 is a high voltage transistor, and is made conductive in response to a voltage Vbls on path 608. During a sense operation, such as a read or verify operation, a pre-charge operation occurs in which a capacitor in the pre-charge circuit 614 is charged. A voltage is applied to a selected word line. In a designated time period, the BLC transistor 611 and the BLS transistor 612 are made conductive to allow the bit line 202 to communicate with the sense node 610. If a selected storage element is conductive, e.g., if its gate-to-source voltage is greater than its Vth, then the pre-charge voltage will discharge through the NAND string in a current path 623 and into the source 210 so that the source acts as a current sink, in one possible sensing technique.

At a designated time after the bit line 202 is allowed to communicate with the sense node 610, the cell current discriminator 616 will measure the current flow, icell. In particular, if the selected storage element is in a conductive state, a relatively high current will flow. If the selected storage element is in a non-conductive state, no or relatively little current will flow. In one possible approach, the cell current discriminator 616 determines whether the conduction current is higher or lower than a given demarcation current. If the current is higher than the demarcation current, the selected storage element is in a conductive state. For a verify operation, a verify status of pass is associated with the storage element. If the current is not higher than the demarcation current, the selected storage element is in a non-conductive state, and a verify status of no pass is associated with the storage element. The verify status can be in the latch 618.

In another possible current sensing approach, the sense module 580 determine a voltage drop which is tied to a fixed current flow by the relationship $\Delta V = i \cdot t/C$, where $\Delta V$ is the voltage drop, i is the fixed current, t is a predetermined discharge time period and C is the capacitance of the pre-charged capacitor in the pre-charge circuit 614. At the end of a given discharge period, since i and C are fixed, $\Delta V$ for a given current can be determined. In one approach, a p-mos transistor is used to determine a level of $\Delta V$ relative to a demarcation value.

In another possible approach, the sense module 580 uses voltage sensing. Voltage sensing, unlike current sensing, does not involve sensing a voltage drop which is tied to a fixed current. Instead, voltage sensing involves determining whether charge sharing occurs between a capacitor in a voltage sensing module and a capacitance of the bit line. Current is not fixed during the sensing. Little or no charge sharing occurs when the selected storage element is not conductive, in which case the voltage of the capacitor in the voltage sensing module does not drop significantly. Charge sharing occurs when the selected storage element is conductive, in which case the voltage of the capacitor in the voltage sensing module drops significantly.

Regardless of the sensing technique which is used, the sensing module 580 can determine whether the selected storage element is in a conductive or non-conductive state. A threshold voltage of the selected storage element is above or below a compare level, such as a verify level (e.g., Vva, VvaL, VvaH, Vvb, VvbL, VvbH, Vvc, VvLM) or a read level (e.g., Vra, Vrb, Vrc), when the selected storage element is in a non-conductive state or a conductive state, respectively.

A result of the sensing (e.g., pass or no pass) is latched by the latch 618. The sense module 619 controls a grounding transistor 625 to set Vbl=0 V in some situations, as explained further below. See, e.g., FIG. 12A.

Figure 7A:
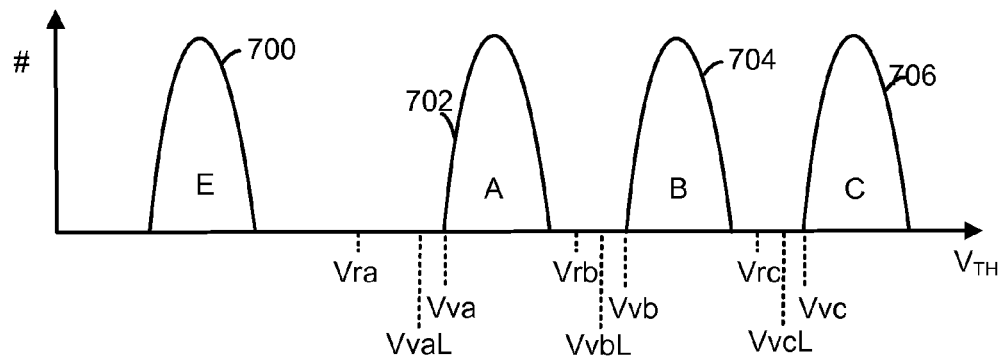
FIG. 7A depicts an example set of threshold voltage distributions.

FIG. 7A depicts an example set of threshold voltage distributions for a four-state memory device in which each storage element stores two bits of data. A first threshold voltage (Vth) distribution 700 is provided for erased (E-state) storage elements. Three Vth distributions 702, 704 and 706 represent programmed states A, B and C, respectively. In one embodiment, the threshold voltages in the E-state are negative and the threshold voltages in the A, B and C distributions are positive.

Three read reference voltages, Vra, Vrb and Vrc, are also provided for reading data from storage elements. By testing whether the threshold voltage of a given storage element is above or below Vra, Vrb and Vrc, the system can determine the state, e.g., programming condition, the storage element is in.

Further, three verify reference voltages, Vva, Vvb and Vvc, are provided. When programming storage elements to the A-state, B-state or C-state, the system will test whether those storage elements have a threshold voltage greater than or equal to Vva, Vvb or Vvc, respectively.

Figure 8A:
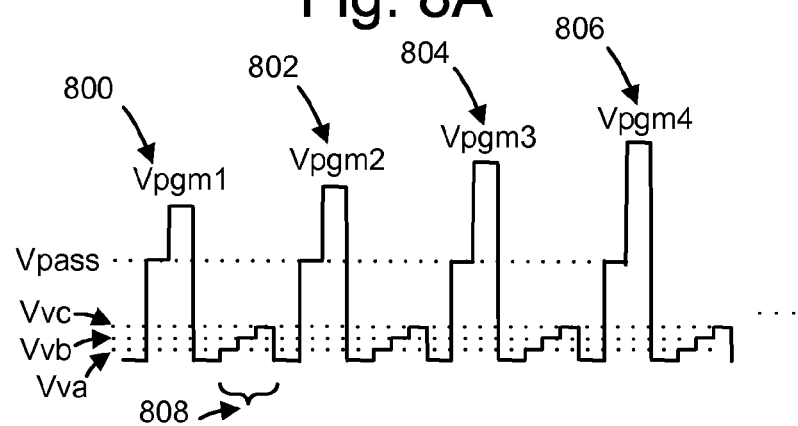
FIG. 8A depicts a series of program and verify pulses which are applied to a selected word line during a programming operation.

In one embodiment, known as full sequence programming, storage elements can be programmed from the E-state directly to any of the programmed states A, B or C. For example, a population of storage elements to be programmed may first be erased so that all storage elements in the population are in the E-state. A series of program pulses such as depicted in FIG. 8A will then be used to program storage elements directly into states A, B or C. While some storage elements are being programmed from the E-state to the A-state, other storage elements are being programmed from the E-state to the B-state and/or from the E-state to the C-state.

Another option is to use low and high verify levels for one or more data states. For example, VvaL and Vva are lower and higher verify levels, respectively, for the A-state, VvbL and Vvb are lower and higher verify levels, respectively, for the B-state, and VvcL and Vvc are lower and higher verify levels, respectively, for the C-state. In some case, VvcL is not used since reduced programming precision may be acceptable for the highest state. During programming, when the Vth of a storage element which is being programmed to the A-state as a target state exceeds VvaL, the programming speed of the storage element is slowed down, in a slow programming mode, such as by raising the associated bit line voltage to a level, e.g., 0.6-0.8 V, which is between a nominal program or non-inhibit level, e.g., 0 V and a full inhibit level, e.g., 2.5 V. This provides greater accuracy by avoiding large step increases in threshold voltage. When the Vth reaches Vva, the storage element is locked out from further programming.

Similarly, when the Vth of a storage element which is being programmed to the B-state as a target state exceeds VvbL, the programming speed of the storage element is slowed down, and when the Vth reaches Vvb, the storage element is locked out from further programming. Optionally, when the Vth of a storage element which is being programmed to the C-state as a target state exceeds VvcL, the programming speed of the storage element is slowed down, and when the Vth reaches Vvc, the storage element is locked out from further programming. This programming technique has been referred to as a quick pass write (QPW) or dual verify technique. Note that, in one approach, dual verify levels are not used for the highest state since some overshoot is typically acceptable for that state. Instead, the dual verify levels can be used for the programmed states, above the erased state, and below the highest state.

Figure 7B:
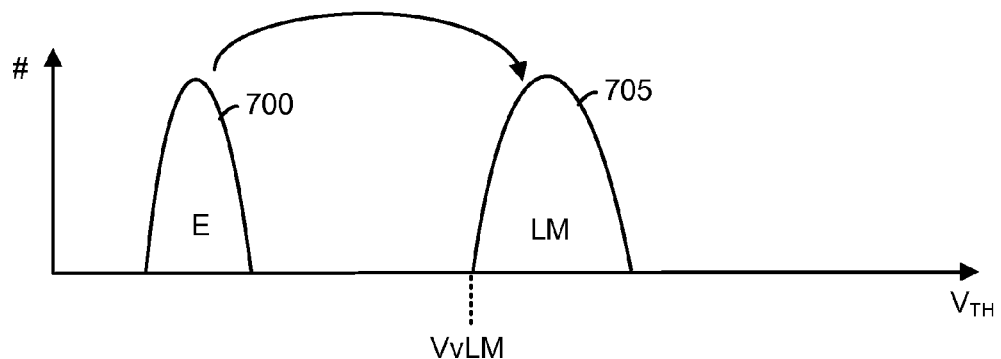
FIG. 7B illustrates a first pass of a two-pass programming technique.

FIG. 7B illustrates a first pass of a two-pass programming technique. In this example, a multi-state storage element that stores data for two different pages: a lower page and an upper page. Four states are depicted by repeating the threshold voltage distributions 700, 702, 704 and 706 from FIG. 7A. These states, and the bits they represent, are: E-state (11), A-state (01), B-state (00) and C-state (10). For E-state, both pages store a "1." For A-state, the lower page stores a "1" and the upper page stores a "0." For B-state, both pages store "0." For C-state, the lower page stores "0" and the upper page stores "1." Note that although specific bit patterns have been assigned to each of the states, different bit patterns may also be assigned.

In the first programming pass, the lower page is programmed for a selected word line WLn. If the lower page is to remain data 1, then the storage element state remains at state E (distribution 700). If the data is to be programmed to 0, then the threshold voltage of the storage elements on WLn are raised such that the storage element is programmed to an intermediate (LM or lower middle) state (distribution 705).

Figure 8B:
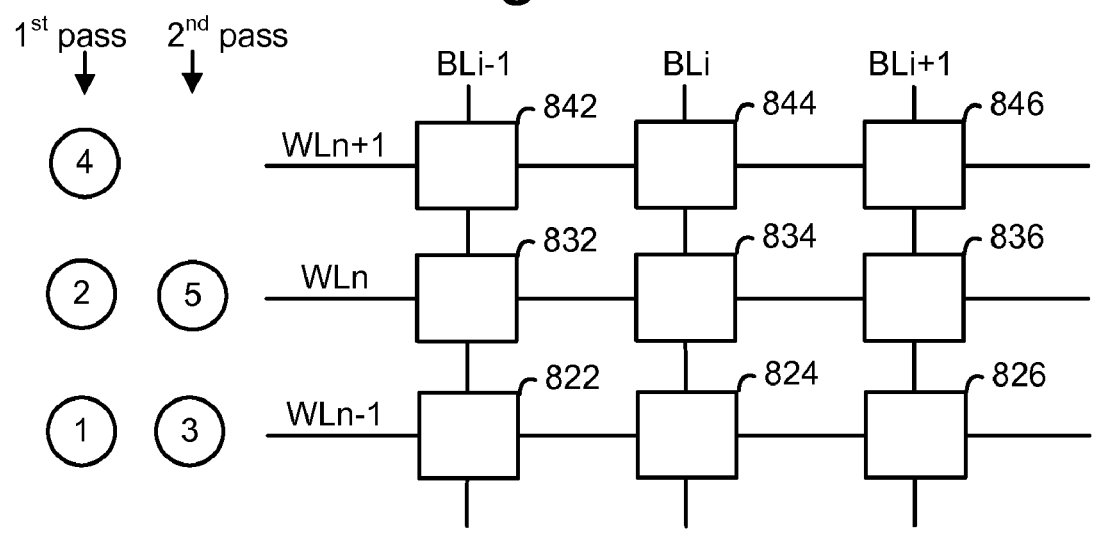
FIG. 8B depicts a multi-pass program operation for a set of storage elements.

In one embodiment, after a storage element is programmed from the E-state to the LM-state, as indicated by step "1" in FIG. 8B, its neighbor storage element on an adjacent word line WLn+1 in the NAND string will then be programmed with respect to its lower page in a respective first programming pass of the adjacent word line, as indicated by step "2" in FIG. 8B.

Figure 7C:
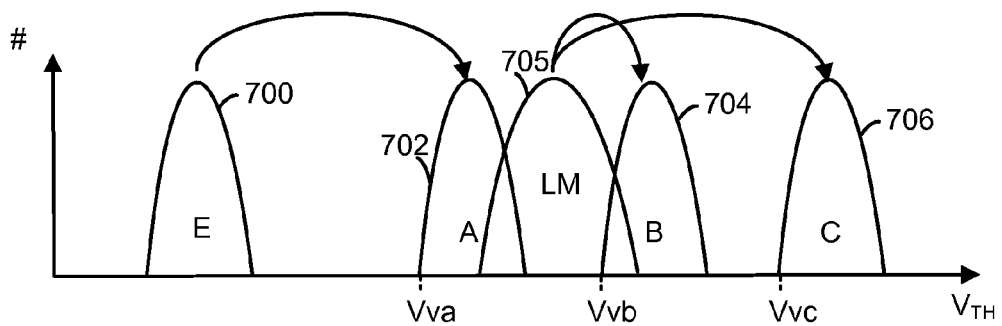
FIG. 7C illustrates a second pass of the two-pass programming technique of FIG. 7B.

FIG. 7C illustrates a second pass of the two-pass programming technique of FIG. 7B. The A-state storage elements are programmed from the E-state distribution 700 to the A-state distribution 702, the B-state storage elements are programmed from the LM-state distribution 705 to the B-state distribution 704, and the C-state storage elements are programmed from the LM-state distribution 705 to the C-state distribution 706. The second pass of the two-pass programming technique for WLn is indicated by step "3" in FIG. 8B. The second pass of the two-pass programming technique for WLn+1 is indicated by step "5" in FIG. 8B.

Figure 7D:
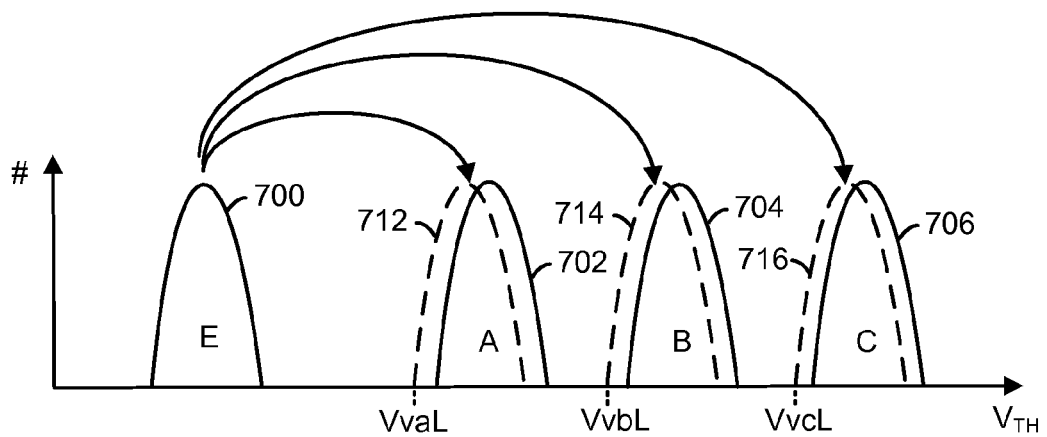
FIG. 7D illustrates a first pass of another two-pass programming technique.

FIG. 7D illustrates a first pass of another two-pass programming technique. In this example, referred to as foggy-fine programming, the A-state, B-state and C-state storage elements are programmed from the E-state to distributions 712, 714 and 716, respectively, using lower verify levels VvaL, VvbL and VvcL, respectively. This is the foggy programming pass. A relatively large program pulse step size may be used, for instance, to quickly program the storage elements to the respective lower verify levels.

Figure 7E:
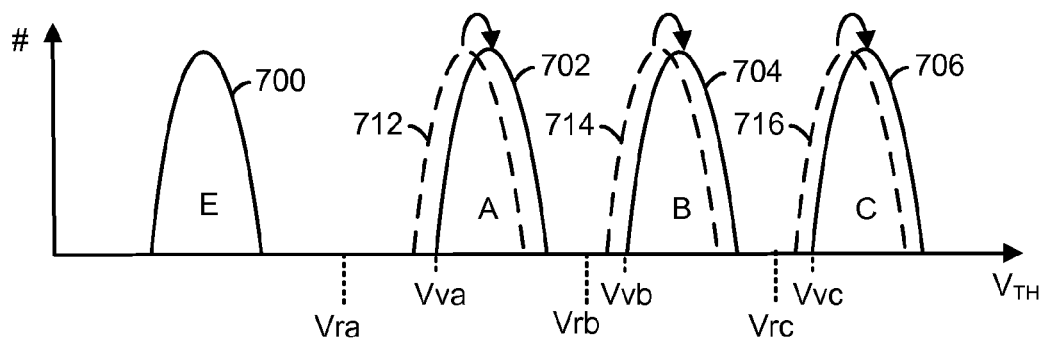
FIG. 7E illustrates a second pass of the two-pass programming technique of FIG. 7D.

FIG. 7E illustrates a second pass of the two-pass programming technique of FIG. 7D. The A-state, B-state and C-state storage elements are programmed from the respective lower distributions to respective final distributions 702, 704 and 706, respectively, using the nominal, higher verify levels Vva, Vvb and Vvc, respectively. This is the fine programming pass. A relatively small program pulse step size may be used, for instance, to slowly program the storage elements to the respective final verify levels while avoiding a large overshoot.

Although the programming examples depict four data states and two pages of data, the concepts taught can be applied to other implementations with more or fewer than four states and more or fewer than two pages. For example, memory devices with eight or sixteen states per storage element are currently planned or in production.

Moreover, in the example programming techniques discussed, the Vth of a storage element is raised gradually as it is programmed to a target data state.

FIG. 8A depicts a series of program and verify pulses which are applied to a selected word line during a programming operation. A programming operation may include multiple program-verify iterations, where each iteration applies, to a selected word line, a program portion having one or more program pulses followed by a verify portions having one or more verify voltages. In one possible approach, the program pulses are stepped up in successive program-verify iterations. Moreover, each program pulse may include a first portion which has a pass voltage (Vpass) level, e.g., 6-8 V, followed by a second, highest amplitude portion at a program level, e.g., 12-25 V. For example, a first, second, third and fourth program pulses 800, 802, 804 and 806 have program levels of Vpgm1, Vpgm2, a Vpgm3 and Vpgm4, respectively, and so forth. One or more verify voltages, such as Vva, Vvb and Vvc (808), may be provided after each program pulse. In some cases, one or more initial program pulses are not followed by verify pulses because it is not expected that any storage elements have reached the lowest program state (e.g., A-state). Subsequently, program-verify iterations may use verify pulses for the A-state, followed by program-verify iterations which use verify pulses for the A- and B-states, followed by program-verify iterations which use verify pulses for the B- and C-states, for instance.

FIG. 8B depicts a multi-pass program operation for a set of storage elements. The components depicted may be a subset of a much larger set of storage elements, word lines and bit lines. In one possible program operation, storage elements on WLn−1, e.g., storage elements 822, 824 and 826, are programmed in a first programming pass. This step is represented by the circled "1." Next ("2"), storage elements on WLn, e.g., storage elements 832, 834 and 836, are programmed in a first programming pass. In this example, when a word line is selected for programming, verify operations occur after each program pulse. During the verify operations on WLn, one or more verify voltages are applied to WLn and pass voltages are applied to the remaining word lines including WLn−1 and WLn+1. The pass voltages are used to turn on (make conductive) the unselected storage elements so that a sensing operation can occur for the selected word line. Next ("3"), storage elements on WLn−1 are programmed in a second programming pass. Next ("4"), storage elements on WLn+1, e.g., storage elements 842, 844 and 846, are programmed in a first programming pass. Next ("5"), the storage elements on WLn are programmed in a second programming pass to their respective target states.

The main reason to program the storage elements in such a back-and-forth word line order is to minimize the Vth shift on neighboring WL storage elements, after the selected WL storage elements have been programmed to its final pass. A higher Vth shift on neighboring storage elements after the selected WL storage elements complete programming results in higher interference effects on the selected WL storage elements, which widen their Vth distributions. Thus, reducing the Vth shift on neighboring WL storage elements after the selected WL storage elements complete programming reduces the interference effects seen by selected storage elements and hence minimizes the Vth distribution widening seen by them. However, some floating gate-to-floating gate coupling can still occur, and this is addressed by the techniques discussed herein.

Figure 9:
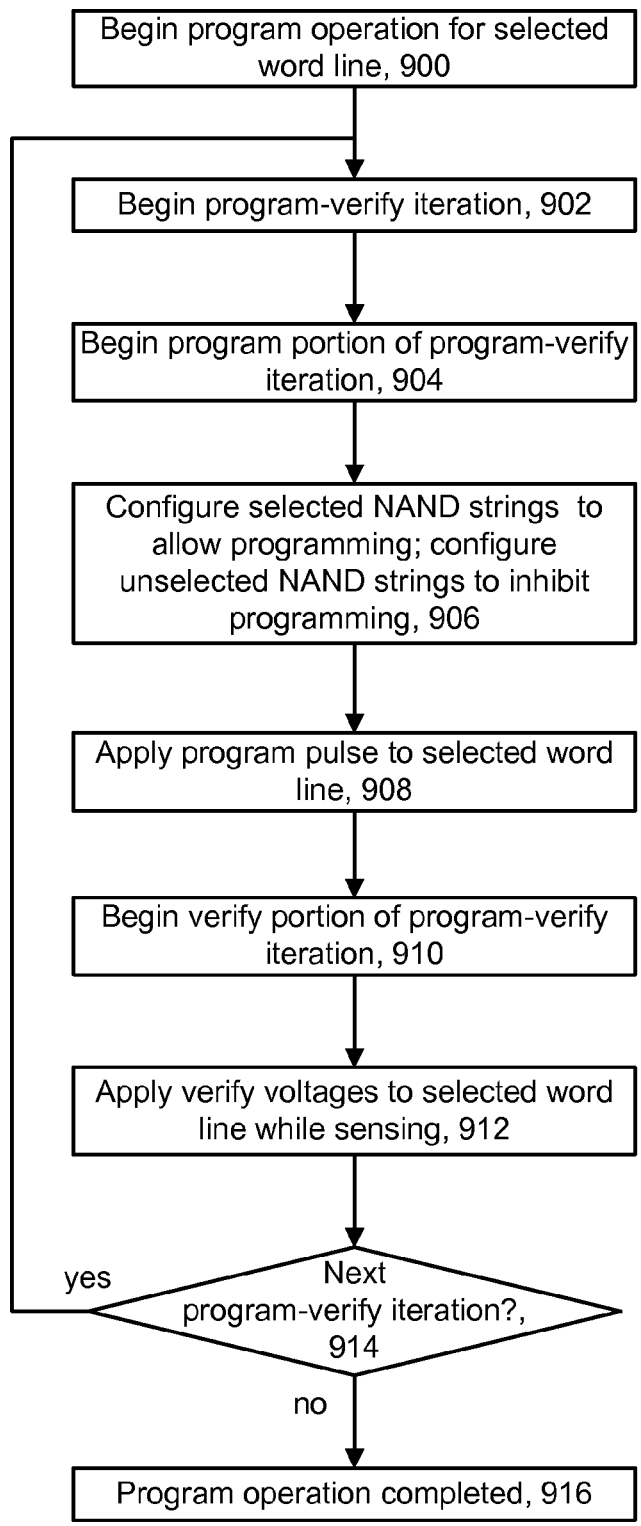
FIG. 9 depicts an example program operation.

FIG. 9 depicts an example program operation. At step 900, a program operation begins for a selected word line and associated selected storage elements. At step 902, a program-verify iteration begins. At step 904, a program portion of a program-verify operation begins. Step 906 configures selected NAND strings to allow programming, and configures unselected NAND strings to inhibit programming. A selected NAND string has a storage element in communication with the selected word line which is undergoing programming in the program-verify iteration. An unselected NAND string does not have a storage element in communication with the selected word line which is undergoing programming in the program-verify iteration. An unselected NAND string could include, e.g., a storage element which has not undergone any programming in the program operation, such as an erased state storage element, or a storage element which has undergone and completed programming in a current or prior program-verify iteration of the program operation.

Configuring a selected NAND string to allow programming can include setting an associated channel to a level which allows programming, such as 0-0.6 V, by appropriate control of Vbl and Vsgd. Configuring a selected NAND string to inhibit programming can include setting an associated channel to a level which prevents programming, such as 2-4 V, by appropriate control of Vbl and Vsgd.

Step 908 applies a program pulse to the selected word line. Step 910 begins a verify portion of the program-verify iteration. Step 912 applies verify voltages to the selected word line while sensing a conductive state of the selected storage elements. At decision step 914, if there is a next program-verify iteration, the process is repeated starting at step 902. At decision step 914, if there is no next program-verify iteration, the program operation is completed, at step 916. Program-verify iterations can be repeated until all, or nearly all selected storage elements have been programmed, or until a maximum limit is reached.

Figure 10:
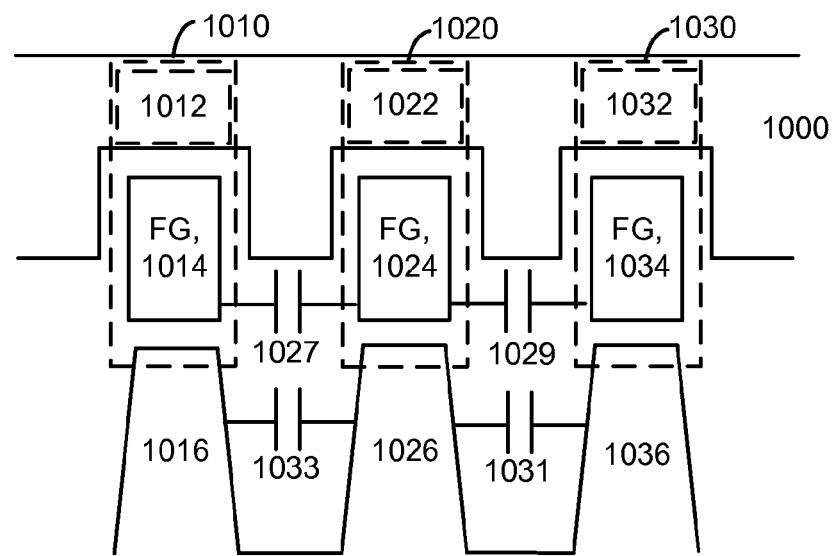
FIG. 10 depicts a cross-sectional view of NAND strings showing channel-to-channel coupling and floating gate-to-floating gate coupling.

FIG. 10 depicts a cross-sectional view of NAND strings showing channel-to-channel coupling and floating gate-to-floating gate coupling. A bit line or NAND string direction goes into the page, and a word line direction goes from left to right. A word line 1000 extends across multiple NAND strings. A first NAND string includes a channel region 1016. A storage element 1010 in the first NAND string includes a control gate 1012, which is a portion of the word line 1000, and a floating gate 1014. A second NAND string includes a channel region 1026. A storage element 1020 in the second NAND string includes a control gate 1022, which is a portion of the word line 1000, and a floating gate 1024. A third NAND string includes a channel region 1036. A storage element 1030 in the third NAND string includes a control gate 1032, which is a portion of the word line 1000, and a floating gate 1034.

As memory devices are scaled down, storage element-to-storage element interferences play an increasingly important role. These interferences can occur during both programming and sensing. For example, capacitive coupling path 1031 extends between channel regions 1026 and 1036, and represents channel-to-channel coupling from a source storage element 1030 to a receiving storage element 1020, for instance. Similarly, capacitive coupling path 1033 extends between channel regions 1016 and 1026. Capacitive coupling path 1029 extends between floating gates 1034 and 1024, and represents floating gate-to-floating gate coupling from the source storage element 1030 to the receiving storage element 1020, for instance. Similarly, capacitive coupling path 1027 extends between floating gates 1014 and 1024. Coupling between a floating gate of one storage element and the channel of a neighbor storage element is also possible.

As mentioned at the outset, a verify operation of a subject storage element can be affected by capacitive coupling from the floating gate and channel of neighboring storage elements. Whether the capacitive coupling causes a difference between the verify and read Vth is a probabilistic phenomenon dependent on the target program states for the neighbor storage elements and their relative program speeds.

For example, the Vth of storage element 1020 will appear to be higher due to capacitive coupling from the floating gates 1014 and 1034 if storage element 1020 completes programming before storage elements 1010 and 1030. On the other hand, if the storage element 1020 is verified under one set of neighboring channel capacitive coupling conditions and read back under another set of neighboring channel capacitive coupling conditions, a wider Vth distribution with lower tail could be seen. Those are two opposite effects. Techniques provided herein lead to a narrower voltage distribution by offsetting or partially offsetting these effects.

Figure 11:
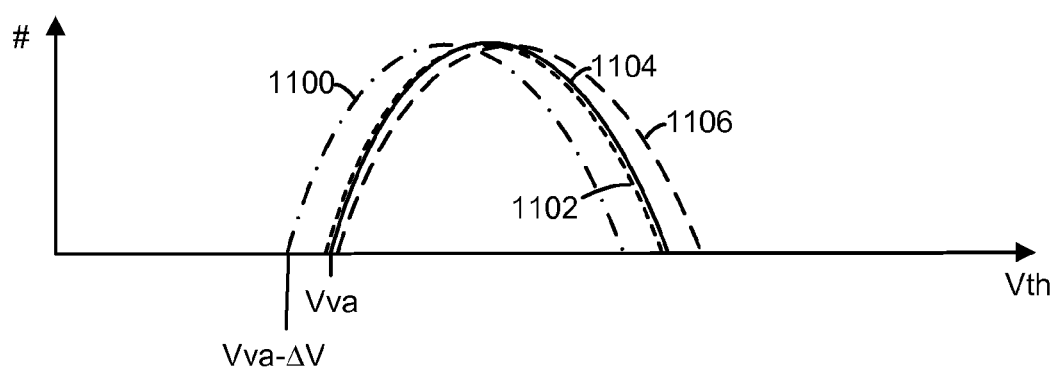
FIG. 11 depicts example threshold voltage distributions of a data state due to capacitive coupling.

FIG. 11 depicts example threshold voltage distributions of a data state due to capacitive coupling. An A-state distribution is depicted as an example, but the discussion applies generally to a programmed data state which is below a highest data state. Vth distribution 1104 represents an optimal distribution which has a low end at Vva. During a program operation, the Vth distribution 1104 is realized when the A-state storage elements reach a verify status of pass so that their programming is completed for the current program operation. That is, the Vth distribution 1104 would be obtained from a hypothetical read operation which occurs immediately after the A-state storage elements complete programming. However, during the program operation, programming continues for other storage elements with higher target data states, such as B-state and C-state storage elements. When these storage elements reach a verify status of pass, their Vth is higher than when the A-state storage elements reach a verify status of pass. As a result, there is additional capacitive coupling which tends to raise the tail of the Vth distribution, so that the Vth distribution 1106 would be obtained from a read operation.

For example, in the programming technique of FIG. 7D, after the A-state storage elements complete programming, the Vth of the B- and C-state storage elements will continue increasing to VvbL and VvcL, respectively, from a level of the A-state. The floating gate-to-floating gate coupling caused by the B- and C-state storage elements to the A-state storage elements, on average, is proportional to VvbL-VvaL and VvcL-VvaL, respectively. In contrast, in the programming technique of FIG. 7C, the A-state storage elements are programmed from the E-state to Vva at the same time the B- and C-state storage elements are programmed from the LM state to Vvb and Vvc, respectively. In practice, the initial program pulses which have a relatively low Vpgm are sufficient to program the A-state storage elements to Vva, but the Vth of the B- and C-state storage elements will not increase significantly. After the average A-state storage element reaches Vva, the Vpgm increases further, causing the Vth of the B- and C-state storage elements to increase toward Vvb and Vvc, respectively. The floating gate-to-floating gate coupling caused by the B- and C-state storage elements to the A-state storage elements, on average, is proportional to the transitions of Vvb-VvLM and Vvc-VvLM, respectively.

In one approach, this floating gate-to-floating gate coupling can be reduced by lowering a channel voltage of the storage elements with higher target data states which have not reached the verify pass status, in a given verify operation. In this case, the Vth distribution 1100 would be realized in a hypothetical read operation which occurs immediately after the A-state storage elements reach their verify status of pass. Essentially, the distribution is shifted down by an amount ΔV since a higher channel voltage is used in the read operation than in the verify operation. In a read operation, typically all channels are at a high pre-charge level to allow sensing to occur. As programming continues for the other storage elements with higher target data states, a Vth distribution 1102 similar to the optimal Vth distribution 1104 is advantageously seen due to the additional floating gate-to-floating gate coupling which occurs.

A read operation typically applies a relatively high, nominal voltage to each bit line for a set of adjacent storage elements on a word line. By creating a situation in which the bit line voltage is lower during a verify operation compared to a read operation, for selected storage elements which are potential sources of floating gate-to-floating gate coupling in subsequent program-verify iterations, an offsetting channel-to-channel coupling is provided.

Specific scenarios which achieve an optimal Vth distribution are discussed next.

FIG. 12A depicts waveforms used in an example verify portion using current sensing of a program-verify iteration, where an ascending sequence of verify voltages is applied to a selected word line. Vwl-sel is the voltage applied to a selected word line. Vwl-unsel is the voltage applied to an unselected word line. Vsen is the voltage at the sense node 610 of the sense module 580 (FIG. 6). Vbls is the voltage at the control gate of the BLS transistor 612 of the sense module 580 (FIG. 6). Vblc is the voltage at the control gate of the BLC transistor 611 of the sense module 580 (FIG. 6). Vbl is a bit line voltage which can be impressed upon a channel, and can be approximately equal to a channel voltage. In one approach, Vbl=Vblc−Vth of the BLC transistor. Vbl1 is the voltage for bit lines of E-state storage elements, which do not have a verify status (or which all have a verify status of pass), for bit lines of A-state storage elements (storage elements whose target data state is the A-state), regardless of whether their verify status is pass or no pass, and for bit lines of B- and C-state storage elements (storage elements whose target data state is the B- or C-state), which have a verify status of pass. Vbl2a is the voltage for bit lines of B-state storage elements which have a verify status of no pass. Vbl3a is the voltage for bit lines of C-state storage elements which have a verify status of no pass. Vsgs is the voltage of the SGS select gate and Vsgd is the voltage of the SGD selected gate.

At t0, Vwl-unsel is raised to Vread, in a word line pre-charge step. At t1, Vsen is set to Vpre-charge. From t1-t3, Vwl−sel=Vva, from t2-t3, BLS is made conductive for selected NAND strings to allow the sense node to communicate with the bit lines represented by Vbl1. Vbl1 is set to a nominal (N) level, Vbl1N=VblcN−Vth, such as a level used in a sensing operation. The dashed line for Vsen indicates the sense node discharging when the sensed storage element is in a conductive state. Just before t3, a sensing strobe is issued to latch a result of the sensing (e.g., pass or no pass). The verify status is pass if Vsen drops below a threshold level, or no pass if Vsen does not drop below the threshold level. From t1-t3, Vbl2a and Vbl3a are grounded, in one approach. This can be achieved by rendering the ground transistor 625 and the BLS transistor (FIG. 6) in a conductive state while rendering the BLC transistor in a non-conductive state (e.g., BLC voltage=0 V). These grounded bit lines are associated with the storage elements which will have their Vth increased as programming continues, causing floating gate-to-floating gate coupling for A-state storage elements, and tending shifting their Vth higher. By lowering the voltages selectively for these bit lines, the voltages of the associated channel regions are also lowered, so that channel-to-channel coupling is enhanced. This acts as an offset to the floating gate-to-floating gate coupling, so that an optimal Vth distribution for the A-state storage elements can be achieved. The same process applies to other states such as for B-state storage elements.

Each of the periods t1-t3, t3-t5 and t5-t7 may be considered to be a time period of a respective verify operation.

Vsgs is set high at t2 to allow the NAND strings to communicate with the source line, which may be grounded, for instance. Vsgd is set high at t2 to allow the NAND strings to communicate with the bit lines. Vsgd may be sufficiently high to allow the SGD gates to act as pass gates which pass substantially all of the bit line voltage to the channel.

The sensing process is repeated for each verify voltage, setting Vbl to 0 V or other low level, to a relatively high, nominal voltage, VblN, or to some intermediate level, as a function of the target data state associated with the current verify voltage (or as a function of the current verify voltage itself), the target data of the storage element associated with the bit line, and, in some cases, the pass or no pass status of the storage element associated with the bit line.

From t3-t5, Vvb is applied to the selected word line and, from t4-t5, BLS is made conductive for all NAND strings. By t5, a sensing strobe is issued to latch a result of the sensing. From t1-t5, Vbl3*a* is grounded, in one approach. These grounded bit lines are associated with the storage elements which will have their Vth increased as programming continues, causing floating gate-to-floating gate coupling for neighboring A- and B-state storage elements, and tending shifting their Vth higher. By lowering the voltages selectively for these bit lines, the voltages of the associated channel regions are also lowered, so that channel-to-channel coupling is enhanced. This acts as an offset to the floating gate-to-floating gate coupling, so that an optimal Vth distribution for the A- and B-state storage elements can be achieved.

The bit line voltages are lowered selectively to the storage elements with a verify status of no pass because these storage elements will be sources of floating gate-to-floating gate coupling as they continue to be programmed in subsequent program-verify iterations. The bit line voltages need not be lowered for the storage elements with a verify status of pass because these storage elements will not be sources of floating gate-to-floating gate coupling, since their programming has completed. Also, as discussed in connection with FIG. 12D, the lowering of the bit line voltages can be more pronounced for the storage elements with a verify status of no pass which have a relatively longer way to go to complete programming. As an example, during Vva, a lower bit line voltage can be used for a C-state storage element than for a B-state storage element, since the C-state storage element will require more program-verify iterations to complete programming than a B-state storage element, on average.

From t5-t7, Vvc is applied to the selected word line and, from t6-t7, BLS is made conductive for all NAND strings. By t7, a sensing strobe is issued to latch a result of the sensing. In one approach, no bit lines are grounded, because no bit lines are associated with the storage elements which will have their Vth increased as programming continues. This is true since the highest data state is being programmed. There will be no significant floating gate-to-floating gate coupling for C-state storage elements, on average, which tends to shift their Vth higher.

FIG. 12B depicts a table of bit line voltages for the example of FIG. 12A. As a shorthand notation, P denotes a verify status of pass, and NP denotes verify status of no pass. "N" denotes the nominal bit line voltage VblN. E, A, B and C are the intended data states (A, B and C are target data states). Thus, for example, for the E- and A-states, "N/N" indicates that VblN is provided to the associated bit lines during Vva, Vvb and Vvc, regardless of pass/no pass status. That is, the first N, before the "/" identifies the bit line voltage used when the verify status is pass ("P"), and the second N, after the "/" identifies the bit line voltage used when the verify status is no pass ("NP"). For the B-state storage elements: (a) during Vva, "N/0" indicates that VblN is provided for a verify status of pass, and 0 V is provided for a verify status of no pass, and (b) during Vvb and Vvc, "N/N" indicates that VblN is provided regardless of pass/no pass status. For the C-state storage elements: (a) during Vva and Vvb, "N/0" indicates that VblN is provided for a verify status of pass, and 0 V is provided for a verify status of no pass, and (b) during Vvc, "N/N" indicates that VblN is provided regardless of pass/no pass status.

FIG. 12C depicts a table of bit line voltages for an alternative to the example of FIG. 12A. The capacitive coupling offset which is provided by channel-to-channel coupling can be strongest for the storage elements of the lowest target data state. As a result, good results can still be achieved by lowering the channel-to-channel coupling only when the storage elements of the lowest target data state are being programming. This results in a simplified implementation. The one difference from FIG. 12B is that, for the C-state storage elements: during Vvb, "N/N" indicates that VblN is provided regardless of pass/no pass status.

FIG. 12D depicts alternative waveforms for the B-state and C-state storage elements with a verify status of no pass, in FIG. 12A. The time lines correspond to those in FIG. 12A. Vbl2*b* is the bit line voltage for B-state, no pass storage elements, as an alternative to Vbl2*a* in FIG. 12A, and Vbl3*b* is the bit line voltage for C-state, no pass storage elements, as an alternative to Vbl3*a* in FIG. 12A. The reduction in the channel voltage can be greater when the storage element is expected to require a relatively higher number of additional program-verify iterations to complete programming. That is, the reduction in the channel voltage can be greater when the storage element is expected to incur a relatively larger increase in Vth of its neighboring storage elements after the neighboring storage elements complete programming. For example, during Vva (t1-t3), the Vth of the C-state no pass storage element is further from Vvc than during Vvb (t3-t5), so Vbl3*b* can be lower (VblC1) during Vva than during Vvb (VblC2>VblC1). For the B-state no pass storage element, Vbl2*b* can be set to an intermediate level VblB1. Thus, 0 V≦VblC1<VblC2<VblN and 0 V≦VblC1<VblB1<VblN. VblB1 can be less than, equal to, or greater than VblC2. Typically, VblC1<VblB1 since more coupling offset (lower Vbl) is needed for the C-state than for the B-state. The bit line voltages can be set from the BLC transistor by: VblB1=VblcB1−Vth, VblC1=VblcC1−Vth, and VblC2=VblcC2−Vth.

FIG. 12E depicts a table of bit line voltages for the example of FIG. 12D. Notation similar to FIG. 12B is used. For the E- and A-states, "N/N" indicates that VblN is provided to the associated bit lines during Vva, Vvb and Vvc, regardless of pass/no pass status. For the B-state storage elements: (a) during Vva, "N/B1" indicates that VblN is provided for a verify status of pass, and VblB1 is provided for a verify status of no pass, and (b) during Vvb and Vvc, VblN is provided regardless of pass/no pass status. For the C-state storage elements: (a) during Vva, "N/C1" indicates that VblN is provided for a verify status of pass, and VblC1 is provided for a verify status of no pass, (b) during Vvb, "N/C2" indicates that VblN is provided for a verify status of pass, and VblC2 is provided for a verify status of no pass, and (c) during Vvc, "N/N" indicates that VblN is provided regardless of pass/no pass status.

Figure 12F:
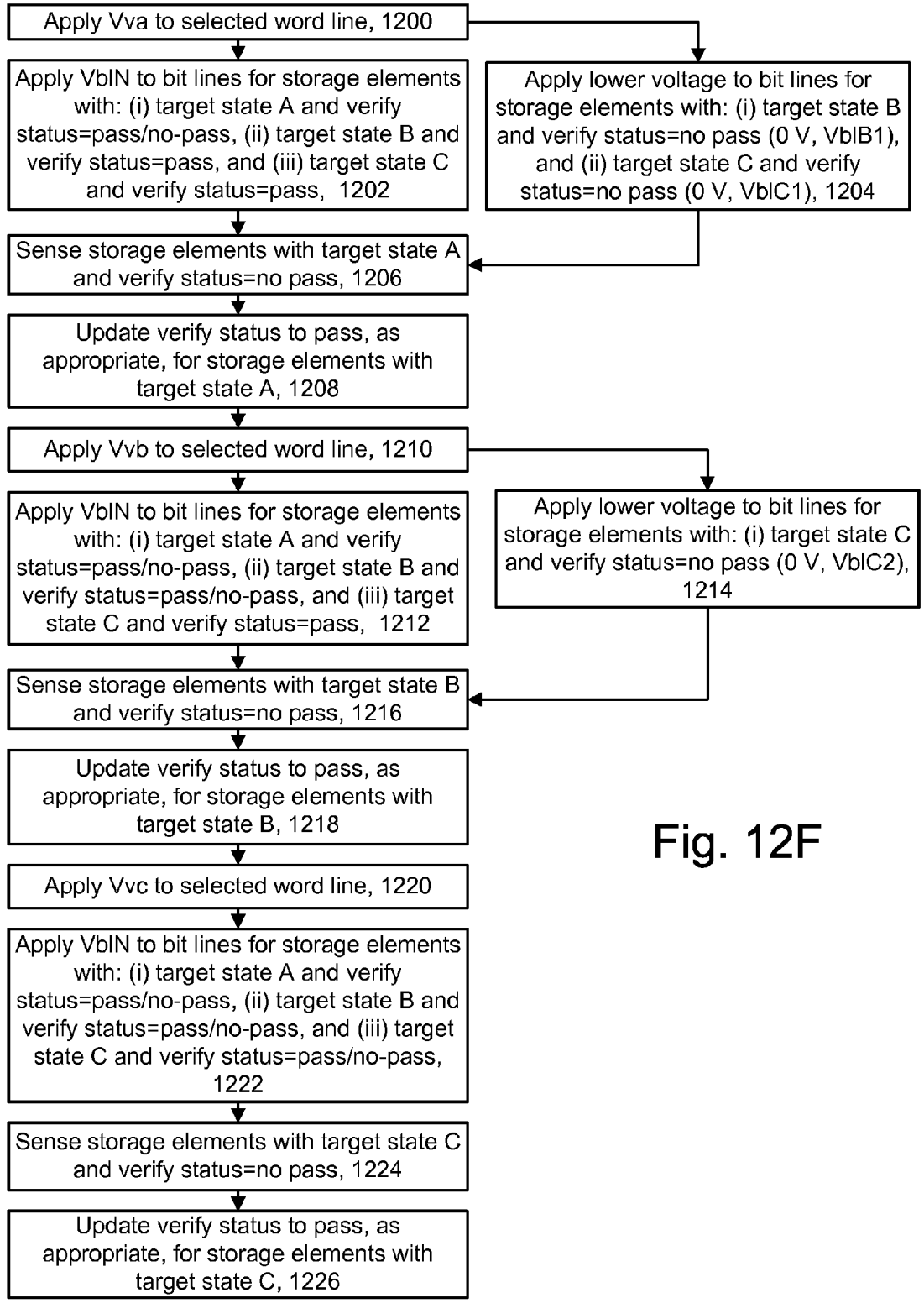
FIG. 12F depicts further details of step 912 of FIG. 9, where verify voltages such as in FIG. 12A are applied to a selected word line.

FIG. 12F depicts further details of step 912 of FIG. 9, where verify voltages such as in FIG. 12A are applied to a selected word line. Step 1200 applies Vva to a selected word line. Step 1202, corresponding to FIG. 12A, or step 1204, corresponding to FIG. 12D, is next. Step 1202 applies VblN to bit lines for storage elements with: (i) target state A and verify status=pass/no pass (pass or no pass), (ii) target state B and verify status=pass, and (iii) target state C and verify status=pass. Step 1204 applies a lower voltage to bit lines for storage elements with: (i) target state B and verify status=no pass (Vbl=0 V or VblB1), and (ii) target state C and verify status=no pass (Vbl=0 V or VblC1). Step 1206 senses storage elements with target state A and verify status=no pass. Based on the sensing, step 1208 updates a verify status to pass, as appropriate, for storage elements with target state A. That is, A-state storage elements which complete programming in the current program-verify iteration have their verify status changed from no pass to pass.

Step 1210 applies Vvb to the selected word line. Step 1212, corresponding to FIG. 12A, or step 1214, corresponding to FIG. 12D, is next. Step 1212 applies VblN to bit lines for storage elements with: (i) target state A and verify status=pass/no pass, (ii) target state B and verify status=pass/no pass, and (iii) target state C and verify status=pass. Step 1214 applies a lower voltage to bit lines for storage elements with: (i) target state C and verify status=no pass (Vbl=0 V or VblC2). Step 1216 senses storage elements with target state B and verify status=no pass. Based on the sensing, step 1218 updates a verify status to pass, as appropriate, for storage elements with target state B. That is, B-state storage elements which complete programming in the current program-verify iteration have their verify status changed from no pass to pass.

Step 1220 applies Vvc to the selected word line. Step 1222 applies VblN to bit lines for storage elements with: (i) target state A and verify status=pass/no pass, (ii) target state B and verify status=pass/no pass, and (iii) target state C and verify status=pass/no pass. Step 1224 senses storage elements with target state C and verify status=no pass. Based on the sensing, step 1226 updates a verify status to pass, as appropriate, for storage elements with target state C. That is, C-state storage elements which complete programming in the current program-verify iteration have their verify status changed from no pass to pass.

Figure 13A:
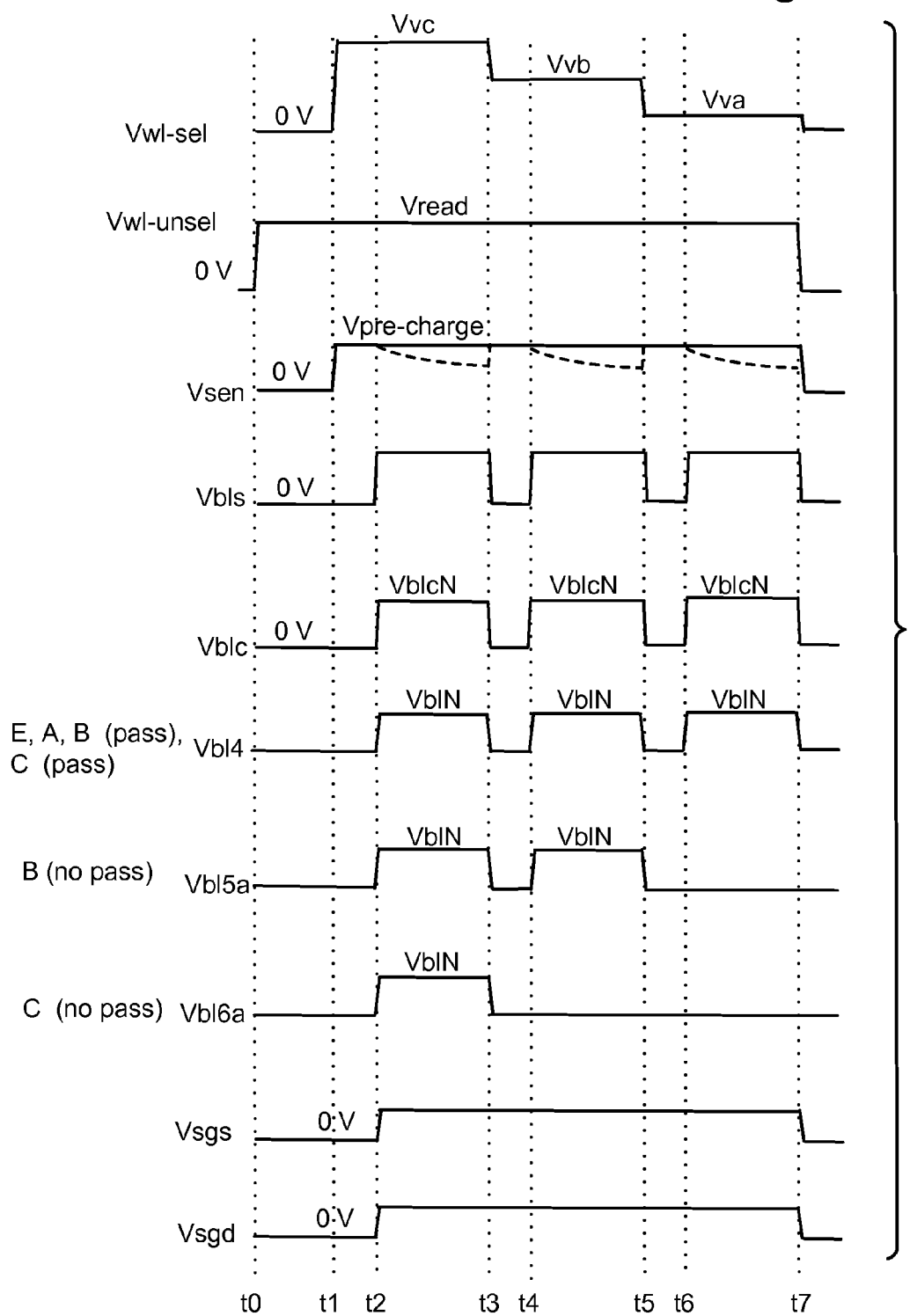
FIG. 13A depicts waveforms used in an example verify portion of a program-verify iteration, where a descending sequence of verify voltages is applied to a selected word line.

FIG. 13A depicts waveforms used in an example verify portion of a program-verify iteration, where a descending sequence of verify voltages is applied to a selected word line. The nomenclature is similar to that in FIG. 12A. By using a descending sequence of verify voltages, it is possible for some of the higher state storage elements to complete programming and attain a verify status of pass in the current program-verify iteration. In contrast, when an ascending sequence of verify voltages is used, such as in the approach of FIG. 12A, when Vva is applied to the selected word line, the B- and C-state storage elements with a status of pass will have attained that status in a prior program-verify iteration. Essentially no floating gate-to-floating gate coupling will occur from a higher state storage element after it attains the verify status of pass. Thus, a compensating measure such as lowering the channel voltage is not indicated. By using a descending sequence of verify voltages, in a given program-verify iteration, we avoid the situation in which a compensating measure such as a lowered channel voltage is applied for a higher state storage element which has attained the verify status of pass in the same program-verify iteration. This is true because the higher state storage elements are verified first in the program-verify iteration. Descending verify voltages may be more difficult to implement due to longer voltage settling times, compared to an ascending sequence of verify voltages.

Vvc is applied from t1-t3, Vvb is applied from t3-t5 and Vva is applied from t5-t7. Vbl4 is the bit line voltage for storage elements with the E-state, A-state and the B- or C-state with a verify status of pass. Vbl5a is the bit line voltage for storage elements with the B-state and a verify status of no pass. Vbl6a is the bit line voltage for storage elements with the C-state and a verify status of no pass. During Vvc, Vbl4, Vbl5a and Vbl6a are set to VblN. During Vvb, Vbl4 and Vbl5a are set to VblN while Vbl6a is grounded. During Vva, Vbl4 is set to VblN while Vbl5a and Vbl6a are grounded.

Each of the periods t1-t3, t3-t5 and t5-t7 may be considered to be a time period of a verify operation.

FIG. 13B depicts a table of bit line voltages for the example of FIG. 13A. Notation similar to FIG. 12B is used. For the E- and A-states, "N/N" indicates that VblN is provided to the associated bit lines during Vvc, Vvb and Vva, regardless of pass/no pass status. For the B-state storage elements: (a) during Vvc and Vvb, "N/N" indicates that VblN is provided regardless of pass/no pass status, and (b) during Vva, "N/0" indicates that VblN is provided for a verify status of pass, and 0 V is provided for a verify status if no pass. For the C-state storage elements: (a) during Vvc, "N/N" indicates that VblN is provided regardless of pass/no pass status, and (b) during Vvb and Vvc, "N/0" indicates that VblN is provided for a verify status of pass, and 0 V is provided for a verify status of no pass. The table is a mirror image of the table of FIG. 12B.

FIG. 13C depicts alternative waveforms for the B-state and C-state storage elements with a verify status of no pass, in FIG. 13A. The time lines correspond to those in FIG. 13A. Benefits similar to those discussed in connection with FIG. 12D can be achieved.

Vbl5b is the bit line voltage for B-state, no pass storage elements, as an alternative to Vbl5a in FIG. 13A, and Vbl6b is the bit line voltage for C-state, no pass storage elements, as an alternative to Vbl6a in FIG. 13A. During Vvc (t2-t3), the channel of the B-state no pass and C-state no pass storage elements can be set to VblN (via Vbl5b and Vbl6b, respectively, by setting VblcN at the BLC transistor). During Vvb (t4-t5), the channel of the B-state, no pass storage element can be set to VblN (via Vbl5b, by setting VblcN at the BLC transistor), while the channel of the C-state, no pass storage element is set to VblC2 (via Vbl6b, by setting VblcC2 at the BLC transistor). During Vva (t6-t7), the channel of the B-state no pass storage elements can be set to VblB1 (via Vbl5b, by setting VblcB1 at the BLC transistor), while the channel of the C-state no pass storage elements is set to VblC1 (via Vbl6b, by setting VblcC1 at the BLC transistor). As before, $0\ V \leq VblC1 < VblC2 < VblN$ and $0\ V \leq VblC1 < VblB1 < VblN$. VblB1 can be less than or greater than VblC2.

FIG. 13D depicts a table of bit line voltages for the example of FIG. 13C. Notation similar to FIG. 12B is used. For the E- and A-states, "N/N" indicates that the associated bit lines are set to VblN during Vvc, Vvb and Vva, regardless of pass/no pass status. For the B-state storage elements: (a) during Vvc and Vvb, "N/N" indicates that VblN is provided regardless of pass/no pass status, and (b) during Vva, "N/B1" indicates that VblN is provided for a verify status of pass, and VblB1 is provided for a verify status of no pass. For the C-state storage elements: (a) during Vvc, "N/N" indicates that VblN is provided regardless of pass/no pass status, (b) during Vvb, "N/C2" indicates that VblN is provided for a verify status of pass, and VblC2 is provided for a verify status of no pass, and (c) during Vva, "N/C1" indicates that VblN is provided for a verify status of pass, and VblC1 is provided for a verify status of no pass. Note that Vbl6a is modified to reach VblC1 from t6-t7 in FIG. 13A in this example. The table is similar to the table of FIG. 13B.

FIG. 14A depicts waveforms used in another example verify portion of a program-verify iteration, where an ascending sequence of verify voltages is applied to a selected word line. These waveforms may be used with a programming technique such as in FIG. 7A, where both lower and higher verify levels for a target data state are used in the same program-verify iteration. For the selected word line, VvaL, VvaH, VvbL, VvbH and Vvc are applied from t1-t3, t3-t5, t5-t7, t7-t9 and t9-t11, respectively. Vbl7 is the bit line voltage for the E- and A-state storage elements, and for the B- and C-state pass storage elements. Vbl8 is the bit line voltage for the B-state no pass storage elements. Vbl9 is the bit line voltage for the C-state no pass storage elements. From t2-t3 and t4-t5, Vbl7 is set to VblN while Vbl8 and Vbl9 are grounded. From t6-t7 and t8-t9, Vbl7 and Vbl8 are set to VblN while Vbl9 is grounded. From t10-t11, Vbl7, Vbl8 and Vbl9 are set to VblN.

Each of the periods t1-t3, t3-t5, t5-t7, t7-t9 and t9-t11 may be considered to be a time period of a verify operation.

FIG. 14B depicts a table of bit line voltages for the example of FIG. 14A. Notation similar to FIG. 12B is used. For the E- and A-states, "N/N" indicates that VblN is provided to the associated bit lines during VvaL, VvaH, VvbL, VvbH and Vvc, regardless of pass/no pass status. For the B-state storage elements: (a) during VvaL and VvaH, "N/0" indicates that VblN is provided for a verify status of pass, and 0 V is provided for a verify status of no pass, and (b) during VvbL, VvbH and Vvc, "N/N" indicates that VblN is provided regardless of pass/no pass status. For the C-state storage elements: (a) during VvaL, VvaH, VvbL and VvbH, "N/0" indicates that VblN is provided for a verify status of pass, and 0 V is provided for a verify status of no pass, and (b) during Vvc, "N/N" indicates that VblN is provided regardless of pass/no pass status.

FIG. 15 depicts a table of bit line voltages for an example verify portion of a program-verify iteration, where eight data states are used. Some examples above relate to a memory device which uses four data states. However, the techniques are generally applicable with a different number of data states, such as eight or sixteen. With eight data states, there are seven target or programmed data states, other than the erased state, having verify levels of Vva, Vvb, Vvc, Vvd, Vve, Vvf and Vvg, for instance, where Vva<Vvb<Vvc<Vvd<Vve<Vvf<Vvg.

Notation similar to FIG. 12B is used. For the E- and A-states, "N/N" indicates that VblN is provided to the associated bit lines during Vva, Vvb, Vvc, Vvd, Vve, Vvf and Vvg, regardless of pass/no pass status.

For the B-state storage elements: (a) during Vva, "N/0" indicates that VblN is provided for a verify status of pass, and 0 V is provided for a verify status of no pass, and (b) during Vvb through Vvg, "N/N" indicates that VblN is provided regardless of pass/no pass status.

For the C-state storage elements: (a) during Vva and Vvb, "N/0" indicates that VblN is provided for a verify status of pass, and 0 V is provided for a verify status of no pass, and (b) during Vvc through Vvg, "N/N" indicates that VblN is provided regardless of pass/no pass status.

For the D-state storage elements: (a) during Vva through Vvc, "N/0" indicates that VblN is provided for a verify status of pass, and 0 V is provided for a verify status of no pass, and (b) during Vvd through Vvg, "N/N" indicates that VblN is provided regardless of pass/no pass status.

For the E-state storage elements: (a) during Vva through Vvd, "N/0" indicates that VblN is provided for a verify status of pass, and 0 V is provided for a verify status of no pass, and (b) during Vve through Vvg, "N/N" indicates that VblN is provided regardless of pass/no pass status.

For the F-state storage elements: (a) during Vva through Vve, "N/0" indicates that VblN is provided for a verify status of pass, and 0 V is provided for a verify status of no pass, and (b) during Vvf and Vvg, VblN is provided regardless of pass/no pass status.

For the G-state storage elements: (a) during Vva through Vvf, "N/0" indicates that VblN is provided for a verify status of pass, and 0 V is provided for a verify status of no pass, and (b) during Vvg, "N/N" indicates that VblN is provided regardless of pass/no pass status.

Alternatively, a descending sequence of verify voltages can be used.

Alternatively, when multiple data states are used, subsets of two or more adjacent data states can be defined and treated commonly in terms of compensating for coupling. This can result in a simplified implementation. In one possible approach, states B and C are grouped, states D and E are grouped and states F and G are grouped.

Note that when multiple programming passes are used, it is generally sufficient to employ the techniques described herein on the final programming pass, since this is when accuracy is most important.

Accordingly, it can be seen that a non-volatile storage system is provided. The non-volatile storage system includes: (a) a set of NAND strings formed on a substrate, each NAND string comprising a storage element in communication with a word line, the storage elements include a plurality of storage elements having one target data state (A), and a plurality of storage elements having another target data state (B, C), higher than the one target data state (A); (b) a plurality of bit lines, including a respective bit line in communication with each NAND string; and (c) at least one control circuit. The at least one control circuit, in connection with one verify operation of a program-verify iteration in which a verify voltage (Vva) of the one target data state (A) is applied to the word line: (i) applies a nominal voltage (VblN) appropriate for sensing to at least one bit line of the plurality of bit lines which is associated with at least one storage element having a verify status of no pass with respect to the one target data state (A); (ii) applies the nominal voltage (VblN) to at least one bit line of the plurality of bit lines which is associated with at least one storage element having the verify status of pass with respect to the another target data state (B); and (iii) applies a voltage (0 V, VblB1) less than the nominal voltage (VblN) to at least one bit line of the plurality of bit lines which is associated with at least one storage element having the verify status of no pass with respect to the another target data state (B).

In another embodiment, a method for operating a non-volatile storage system, comprises, in connection with one verify operation of a program-verify iteration: (i) applying a verify voltage (Vva) of one target data state (A) to a word line, the word line is in communication with a set of NAND strings formed on a substrate, and with a storage element in each NAND string, the storage elements include a plurality of storage elements having the one target data state (A), and a plurality of storage elements having another target data state (B, C), higher than the one target data state (A); (ii) applying a nominal voltage (VblN), appropriate for sensing, to at least one bit line which is associated with at least one storage element having the verify status of no pass with respect to the one target data state (A); (iii) applying the nominal voltage (VblN) to at least one bit line which is associated with at least one storage element having the verify status of pass with respect to the another target data state (B, C); and (iv) applying a voltage (0 V, VblB1, VblC1) less than the nominal voltage to at least one bit line which is associated with at least one storage element having the verify status of no pass with respect to the another target data state (B, C).

In another embodiment, a method for operating a non-volatile storage system, comprises, in connection with one verify operation of a program-verify iteration: (i) applying a verify voltage (Vva) of one target data state (A) to a word line, the word line is in communication with a set of NAND strings formed on a substrate, and with a storage element in each NAND string, the storage elements include a plurality of storage elements having the one target data state (A), and a plurality of storage elements having another target data state (B, C); (ii) by applying a nominal voltage (VblN), appropriate for sensing, to a channel region of the substrate which is associated with at least one storage element having a verify status of no pass with respect to the one target data state (A); (iii) applying the nominal voltage (VblN) to a channel region of the substrate which is associated with the at least one storage element having a verify status of pass with respect to the another target data state (B, C); and (iv) applying a voltage (0 V, VblB1, VblC1) less than the nominal voltage to a channel region of the substrate which is associated with the at least one storage element having the verify status of no pass with respect to the another target data state (B, C).

The foregoing detailed description of the technology herein has been presented for purposes of illustration and description. It is not intended to be exhaustive or to limit the technology to the precise form disclosed. Many modifications and variations are possible in light of the above teaching. The described embodiments were chosen to best explain the principles of the technology and its practical application to thereby enable others skilled in the art to best utilize the technology in various embodiments and with various modifications as are suited to the particular use contemplated. It is intended that the scope of the technology be defined by the claims appended hereto.

What is claimed is:

1. A non-volatile storage system, comprising:
 a set of NAND strings formed on a substrate, each NAND string comprising a storage element in communication with a word line, the storage elements include a plurality of storage elements having one target data state, and a plurality of storage elements having another target data state, higher than the one target data state;
 a plurality of bit lines, including a respective bit line in communication with each NAND string; and
 at least one control circuit, the at least one control circuit, in connection with one verify operation of a program-verify iteration in which a verify voltage of the one target data state is applied to the word line:
  applies a nominal voltage appropriate for sensing to at least one bit line of the plurality of bit lines which is associated with at least one storage element having a verify status of no pass with respect to the one target data state;
  applies the nominal voltage to at least one bit line of the plurality of bit lines which is associated with at least one storage element having a verify status of pass with respect to the another target data state; and
  applies a voltage less than the nominal voltage to at least one bit line of the plurality of bit lines which is associated with at least one storage element having the verify status of no pass with respect to the another target data state.

2. The non-volatile storage system of claim 1, wherein the at least one control circuit, in connection with the one verify operation:
 applies the nominal voltage to at least one bit line of the plurality of bit lines which is associated with at least one storage element having the verify status of pass with respect to the one target data state.

3. The non-volatile storage system of claim 1, wherein: the voltage less than the nominal voltage is non-zero.

4. The non-volatile storage system of claim 1, wherein the at least one control circuit, in connection with another verify operation of the program-verify iteration, in which a verify voltage of the another target data state is applied to the word line:
 applies the nominal voltage to at least one bit line of the plurality of bit lines which is associated with at least one storage element, regardless of a verify status of pass or no pass with respect to the one target data state;
 applies the nominal voltage to the at least one bit line which is associated with at least one storage element having the verify status of pass with respect to the another target data state; and
 applies the nominal voltage to the at least one bit line which is associated with at least one storage element having the verify status of no pass with respect to the another target data state.

5. The non-volatile storage system of claim 4, wherein:
 the storage elements include a plurality of storage elements having an additional target data state; and
 the at least one control circuit, in connection with the one verify operation:
  applies a voltage less than the nominal voltage to at least one bit line of the plurality of bit lines which is associated with at least one storage element having the verify status of no pass with respect to the additional target data state; and
  applies the nominal voltage to at least one bit line of the plurality of bit lines which is associated with at least one storage element having the verify status of pass with respect to the additional target data state.

6. The non-volatile storage system of claim 5, wherein the at least one control circuit, in connection with the another verify operation:
 applies a voltage less than the nominal voltage to the at least one bit line which is associated with the at least one storage element having the verify status of no pass with respect to the additional target data state; and
 applies the nominal voltage to the at least one bit line which is associated with the at least one storage element having the verify status of pass with respect to the additional target data state.

7. The non-volatile storage system of claim 1, wherein:
 the storage elements include a plurality of storage elements having an additional target data state; and the at least one control circuit, in connection with the one verify operation:
applies a voltage less than the voltage which is less than the nominal voltage, to at least one bit line of the plurality of bit lines which is associated with at least one storage element having the verify status of no pass with respect to the additional target data state; and
applies the nominal voltage to at least one bit line of the plurality of bit lines which is associated with at least one storage element having the verify status of pass with respect to the additional target data state.

8. The non-volatile storage system of claim 7, wherein the at least one control circuit, in connection with the program-verify iteration:
applies, to the word line, an increasing sequence of verify voltages, one after another, including the verify voltage of the one target data state, followed by a verify voltage of the another target data state, followed by a verify voltage of the additional target data state.

9. The non-volatile storage system of claim 7, wherein the at least one control circuit, in connection with the program-verify iteration:
applies, to the word line, a decreasing sequence of verify voltages, one after another, including a verify voltage of the additional target data state, followed by the verify voltage of the another target data state, followed by the verify voltage of the one target data state.

10. A method for operating a non-volatile storage system, comprising, in connection with one verify operation of a program-verify iteration:
applying a verify voltage of one target data state to a word line, the word line is in communication with a set of NAND strings formed on a substrate, and with a storage element in each NAND string, the storage elements include a plurality of storage elements having the one target data state, and a plurality of storage elements having another target data state, higher than the one target data state;
applying a nominal voltage, appropriate for sensing, to at least one bit line of a plurality of bit lines which is associated with at least one storage element having a verify status of no pass with respect to the one target data state;
applying the nominal voltage to at least one bit line of the plurality of bit lines which is associated with at least one storage element having a verify status of pass with respect to the another target data state; and
applying a voltage less than the nominal voltage to at least one bit line of the plurality of bit lines which is associated with at least one storage element having the verify status of no pass with respect to the another target data state.

11. The method of claim 10, further comprising, in connection with the one verify operation:
applying the nominal voltage to at least one bit line of the plurality of bit lines which is associated with at least one storage element having the verify status of pass with respect to the one target data state.

12. The method of claim 10, wherein:
the voltage less than the nominal voltage is non-zero.

13. The method of claim 10, further comprising, in connection with another verify operation of the program-verify iteration, in which a verify voltage of the another target data state is applied to the word line:
applying the nominal voltage to the at least one bit line which is associated with the at least one storage element having the verify status of no pass with respect to the another target data state; and
applying the nominal voltage to the at least one bit line which is associated with the at least one storage element having the verify status of pass with respect to the another target data state.

14. The method of claim 10, wherein the storage elements include a plurality of storage elements having an additional target data state, the method further comprising, in connection with the one verify operation:
applying a voltage less than the voltage less than the nominal voltage to at least one bit line of the plurality of bit lines which is associated with at least one storage element having the verify status of no pass with respect to the additional target data state; and
applying the nominal voltage to at least one bit line of the plurality of bit lines which is associated with at least one storage element having the verify status of pass with respect to the additional target data state.

15. The method of claim 14, further comprising, in connection with the program-verify iteration:
applying, to the word line, an increasing sequence of verify voltages, one after another, including the verify voltage of the one target data state, followed by a verify voltage of the another target data state, followed by a verify voltage of the additional target data state.

16. The method of claim 14, further comprising, in connection with the program-verify iteration:
applying, to the word line, a decreasing sequence of verify voltages, one after another, including a verify voltage of the additional target data state, followed by the verify voltage of the another target data state, followed by the verify voltage of the one target data state.

17. A method for operating a non-volatile storage system, comprising, in connection with one verify operation of a program-verify iteration:
applying a verify voltage of one target data state to a word line, the word line is in communication with a set of NAND strings formed on a substrate, and with a storage element in each NAND string, the storage elements include a plurality of storage elements having the one target data state, and a plurality of storage elements having another target data state;
by applying a nominal voltage, appropriate for sensing, to a channel region of the substrate which is associated with at least one storage element having a verify status of no pass with respect to the one target data state;
applying the nominal voltage to a channel region of the substrate which is associated with the at least one storage element having a verify status of pass with respect to the another target data state; and
applying a voltage less than the nominal voltage to a channel region of the substrate which is associated with the at least one storage element having the verify status of no pass with respect to the another target data state.

18. The method of claim 17, further comprising, in connection with the one verify operation:

applying the nominal voltage to a channel region of the substrate which is associated with at least one storage element having the verify status of pass with respect to the one target data state.

19. The method of claim 17, wherein:

the voltage less than the nominal voltage is non-zero.

20. The method of claim 17, wherein the storage elements include a plurality of storage elements having an additional target data state, the method further comprising, in connection with the one verify operation:

applying a voltage less than the voltage less than the nominal voltage to a channel region of the substrate which is associated with at least one storage element having the verify status of no pass with respect to the additional target data state; and applying the nominal voltage to a channel region of the substrate which is associated with at least one storage element having the verify status of pass with respect to the additional target data state.

\* \* \* \* \*